US012731768B2

(12) United States Patent
Tanaka et al.

(10) Patent No.: US 12,731,768 B2
(45) Date of Patent: Sep. 8, 2026

(54) PLASMA PROCESSING APPARATUS

(71) Applicant: Hitachi High-Tech Corporation, Tokyo (JP)

(72) Inventors: Yuki Tanaka, Tokyo (JP); Takamasa Ichino, Tokyo (JP); Shintaro Nakatani, Tokyo (JP); Tomoaki Hyodo, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 359 days.

(21) Appl. No.: 18/691,315

(22) PCT Filed: Mar. 27, 2023

(86) PCT No.: PCT/JP2023/012352

§ 371 (c)(1),
(2) Date: Mar. 12, 2024

(87) PCT Pub. No.: WO2024/201683

PCT Pub. Date: Oct. 3, 2024

(65) Prior Publication Data

US 2025/0232962 A1 Jul. 17, 2025

(51) Int. Cl.
*H05B 3/28* (2006.01)
*H01J 37/32* (2006.01)

(52) U.S. Cl.
CPC .......... *H01J 37/32724* (2013.01); *H05B 3/28* (2013.01)

(58) Field of Classification Search
CPC ............................ H01J 37/32724; H05B 3/28
See application file for complete search history.

(56) References Cited

U.S. PATENT DOCUMENTS 5,558,717 A 9/1996 Zhao et al.
2003/0003749 A1 1/2003 Sexton et al.
(Continued)

FOREIGN PATENT DOCUMENTS

JP H08-227859 A 9/1996
JP 2005-016379 A 6/2005
(Continued)

OTHER PUBLICATIONS

Search Report mailed Jun. 20, 2023 in International Application No. PCT/JP2023/012352.
(Continued)

*Primary Examiner* — Henry Luong
(74) *Attorney, Agent, or Firm* — Miles & Stockbridge, P.C.

(57) ABSTRACT

A plasma processing apparatus including a processing chamber and a cylindrical sample stage disposed within the processing chamber and having an upper surface on which the wafer is placed, the sample stage including a disc-like substrate; a dielectric film covering an upper surface of the substrate; and a heater layer disposed inside the dielectric film. The heater layer includes a plurality of film heaters disposed in a plurality of rectangular regions each disposed with one side of the rectangular shapes facing to adjacent regions. A cylindrical power supply connector detachable from a bottom of the substrate is configured to be electrically connected to each of the plurality of film heaters, and a wiring component includes a plurality of lines and is made of a resin-made plate-like component connected to a bottom of the power supply connector, and has an arm part extending along a bottom surface of the substrate.

5 Claims, 14 Drawing Sheets

(56) References Cited

U.S. PATENT DOCUMENTS

| | | | | |
|---|---|---|---|---|
| 2005/0193953 | A1 | 9/2005 | Makino et al. | |
| 2011/0092072 | A1 | 4/2011 | Singh et al. | |
| 2013/0180662 | A1 | 7/2013 | Sato et al. | |
| 2014/0154819 | A1 | 6/2014 | Gaff et al. | |
| 2015/0214014 | A1 | 7/2015 | Sato et al. | |
| 2018/0211893 | A1 | 7/2018 | Ichino et al. | |
| 2019/0088157 | A1 | 3/2019 | Zhang et al. | |
| 2022/0115216 | A1* | 4/2022 | Ichino ............... | H01J 37/32724 |

FOREIGN PATENT DOCUMENTS

| | | | |
|---|---|---|---|
| JP | 2005-252201 | A | 9/2005 |
| JP | 2007-067036 | A | 3/2007 |
| JP | 2013-508968 | A | 3/2013 |
| JP | 2013-143512 | A | 7/2013 |
| JP | 2014-112672 | A | 6/2014 |
| JP | 2015-141908 | A | 8/2015 |
| JP | 2016-018918 | A | 2/2016 |
| JP | 2017-157855 | A | 9/2017 |
| JP | 2018-120881 | A | 8/2018 |
| KR | 10-2015-0089907 | A | 8/2015 |
| WO | 2011049620 | A2 | 4/2011 |

OTHER PUBLICATIONS

Office Action mailed Oct. 24, 2019 in U.S. Appl. No. 15/715,717.

Notice of Allowance mailed Feb. 12, 2020 in U.S. Appl. No. 15/715,717.

Office Action mailed Jun. 20, 2019 in U.S. Appl. No. 15/715,717.

Office Action mailed Aug. 13, 2018 in Korean Application No. 10-2017-0112446.

* cited by examiner

PLASMA PROCESSING APPARATUS

TECHNICAL FIELD

The present disclosure relates to a plasma processing apparatus, in which a substrate-like sample such as a semiconductor wafer is disposed on an upper surface of a sample stage in a processing chamber inside a vacuum container, and the sample is processed using plasma generated by supplying processing gas into the processing chamber, and particularly relates to a plasma processing apparatus, which includes a plurality of film heaters in a dielectric film covering the upper surface of the sample stage, and processes the sample while controlling temperature of the sample with such heaters.

BACKGROUND ART

In the plasma processing apparatus, to shorten time for etching of a so-called multilayer film, in which multiple films are stacked on a surface of a plate-like sample such as a semiconductor wafer (hereinafter also simply referred to as a wafer), vertically adjacent films are processed within the same processing chamber and without taking wafers out of the processing chamber during processing steps of the respective films.

In such processing, it is important to adjust temperature of the sample stage, which is disposed within the processing chamber, to an appropriate temperature to process the wafer. The sample stage of the plasma processing apparatus therefore has a built-in heater, and when a wafer is processed, temperature of the wafer is adjusted to an appropriate temperature for processing to improve processing accuracy.

As an example of such a plasma processing apparatus, one disclosed in Japanese Unexamined Patent Application Publication No. 2007-67036 (patent literature 1) is known. The patent literature 1 discloses a plasma processing apparatus provided as "vacuum processing apparatus, which includes: a vacuum container the inside of which is depressurized; a sample stage disposed within the vacuum container; and an electrostatic adsorption device provided on the sample stage to hold a semiconductor wafer and generate plasma above the sample stage to etch the semiconductor wafer, where a first dielectric film is formed on a conductive substrate, and a plurality of roughly ring-like electrode films for electrostatic adsorption are formed concentrically spaced apart from each other on the surface of the first dielectric film, and a ring-like heater film is formed between the electrode films in a radial direction, and a second dielectric film is formed on the upper surfaces of the electrode film and the heater film (refer to claim 1)". According to the configuration of the patent literature 1, the temperature distribution in a wafer plane can be changed for each etching condition.

Further, as another example of such a plasma processing apparatus, one disclosed in Japanese Unexamined Patent Application Publication No. 2017-157855 (patent literature 2) is known. The patent literature 2 discloses a plasma processing apparatus, which includes "an electrostatic chuck device, including: an electrostatic chuck part having a placing surface for placing a plate-like sample on one main surface and having an electrostatic adsorption electrode; a temperature adjustment base part disposed on a side opposite the placing surface with respect to the electrostatic chuck part and cooling the electrostatic chuck part; a first heater element including one or multiple main heater(s) to adjust temperature of an adsorption surface of the electrostatic chuck part with one or multiple main heater adjustment region(s); a second heater element including multiple sub-heaters that adjust temperature of each of sub-heater adjustment regions in a larger number than the main heater adjustment regions of the first heater element; and a control unit that controls a voltage applied to the sub-heater. According to the configuration of the patent literature 2, temperature distribution in each of zones divided by the multiple main heaters can be individually controlled, and temperature in each zone can be finely adjusted by the sub-heater. As a result, during holding a plate-like sample, even if partial temperature distribution occurs in the plate-like sample due to a change in plasma generation state or in a film formation condition, temperature distribution can be controlled by finely adjusting the temperature with the sub-heaters.

CITATION LIST

Patent Literature

Japanese Unexamined Patent Application Publication No. 2007-67036

Japanese Unexamined Patent Application Publication No. 2017-157855

SUMMARY OF INVENTION

Technical Problem

When it is considered that a large number of heaters are disposed and temperature of an electrode substrate of the sample stage is controlled, the following problem arises. A total of two holes are required per zone, one for power supply and one for current return, and the holes are more difficult to be disposed with an increase in the number of zones. Even if the holes can be disposed, drilling of a large number of holes would be expensive and difficult.

An object of the disclosure is to provide a technique for making electrodes in a multi-zone heater layer (heater wires) safely, at low cost, and easily.

Solution to Problem

According to one aspect of the present disclosure, a technology (plasma processing apparatus) is provided which includes: a processing chamber that is disposed inside a vacuum container and inside which a wafer to be processed is placed and plasma is generated; and a cylindrical sample stage disposed within the processing chamber and having an upper surface on which the wafer is placed. In the plasma processing apparatus, the sample stage includes: a disc-like substrate; a dielectric film covering an upper surface of the substrate; and a heater layer disposed inside the dielectric film, the heater layer includes a plurality of film heaters respectively disposed in a plurality of rectangular regions, the plurality of regions are each disposed with one sides of the rectangular shapes facing to adjacent regions, a cylindrical power supply connector that is attached to and detached from a bottom of the substrate is provided, the power supply connector is configured to be electrically connected to one location of each of the plurality of film heaters respectively disposed in the plurality of regions to supply power from a DC power source, a wiring component is provided that includes inside thereof a plurality of lines to which the power is supplied and is made of a resin-made plate-like component connected to a bottom of the power supply connector, and the wiring component has an arm part extending along a bottom surface of the substrate.

Advantageous Effects of Invention

It is possible to provide a plasma processing apparatus which can be made safely, at low cost, and easily.

BRIEF DESCRIPTION OF THE DRAWINGS

FIG. 8 illustrates an example of the four grid heaters and polarity reversal at power supply parts of the grid heaters, according to the embodiment.

DESCRIPTION OF EMBODIMENTS

Figure 1:
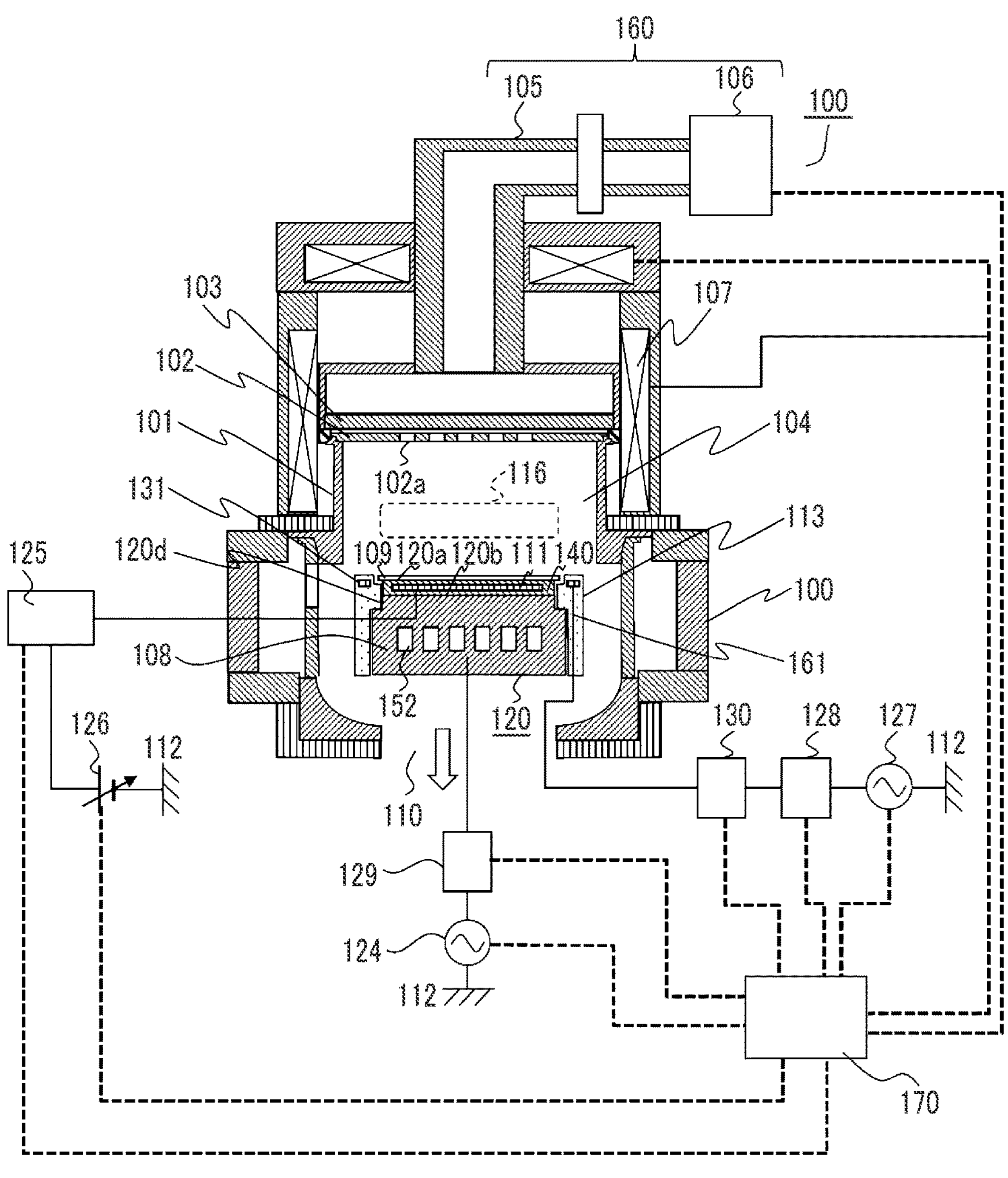
FIG. 1 is a vertical cross sectional diagram schematically illustrating an outline of a configuration of a plasma processing apparatus according to one embodiment.

One embodiment of the invention will now be described with reference to the drawings. In the following description, the same components are designated by the same reference numerals or signs, and the repeated description thereof may be omitted. Although the drawings may be schematically shown compared with an actual aspect to more clarify the description, such an aspect is merely one example and should not restrict interpretation of this disclosure.

Embodiment

Hereinafter, one embodiment of the disclosure is described mainly with reference to FIGS. 1 to 8. FIG. 1 is a cross sectional diagram schematically illustrating an outline of a configuration of a plasma processing apparatus according to one embodiment. In particular, FIG. 1 shows a plasma etching apparatus 100, which uses a microwave electric field as an electric field for plasma generation so that electron cyclotron resonance (ECR) of the microwave electric field and a magnetic field is generated to generate plasma, and uses the plasma to etch a substrate-like sample such as a semiconductor wafer.

The plasma etching apparatus 100 has a vacuum container 101 that includes a processing chamber 104 in which plasma is generated. In the vacuum container 101, a cylindrical upper part is opened, a dielectric window 103 (made of quartz, for example) for introducing the microwave is disposed as a lid component above the upper part, and thus the processing chamber 104 is formed with the inside and the outside that are airtightly partitioned. Further, a vacuum exhaust port 110 is provided at the lower part of the vacuum container 101 so that the vacuum container 101 communicates with an evacuation device (not shown) disposed below and connected to the vacuum container 101.

Further, a shower plate 102 configuring a ceiling surface of the processing chamber 104 is provided below the lower surface of the dielectric window 103 configuring the lid component for the upper part of the vacuum container 101. The shower plate 102 has a plurality of gas introduction holes 102*a* disposed in its central portion, and an etching processing gas is introduced into the processing chamber 104 through the gas introduction holes 102*a*. The shower plate 102 is a disk made of a dielectric material such as quartz, for example.

An electric field/magnetic field generating part 160, which generates an electric field and a magnetic field for generating plasma 116, is disposed outside and above the vacuum container 101. The electric field/magnetic field generating part 160 provided in the plasma etching apparatus 100 has the following configuration. Specifically, the electric field/magnetic field generating part 160 is disposed above the dielectric window 103, and a waveguide 105 is provided so that an electric field is transmitted through the waveguide 105 into the processing chamber 104 to supply a high-frequency electric field of a predetermined frequency in order to generate the plasma 116.

Further, the electric field transmitted through the inside of the waveguide 105 is generated in an oscillating manner by an electric-field generation power source 106. Although frequency of the electric field is not limited, a microwave of 2.45 GHz is used in this embodiment.

A magnetic field generating coil 107 for generating a magnetic field is disposed while surrounding the respective portions above the dielectric window 103 of the processing chamber 104, on the sidewall of the vacuum container 101 forming the cylindrical part of the processing chamber 104, and on the peripheral side of the lower end of the waveguide 105. The microwave electric field generated by the electric-field generation power source 106 propagates inside the waveguide 105, passes through the dielectric window 103 and the shower the plate 102, and is supplied to the processing chamber 104 from above.

Further, electron cyclotron resonance (ECR) is caused by interaction with the magnetic field generated by the magnetic field generating coil 107 and supplied to the processing chamber 104. High density plasma 116 is then generated within the processing chamber 104 by exciting and dissociating atoms or molecules of processing gas introduced into the processing chamber 104 through the gas introduction holes 102*a* of the shower plate 102.

A wafer placing electrode (first electrode) 120 configuring the sample stage is provided below the space that corresponds to the lower part of the processing chamber 104 and in which the plasma 116 is generated. The wafer placing electrode 120 has a placing surface 120*a* on which a semiconductor wafer (hereinafter also simply referred to as a wafer) 109 as a sample (processing object) is placed. The wafer placing electrode 120 is disposed such that its placing surface 120*a* faces the shower plate 102 or the dielectric window 103. In the following, the wafer placing electrode 120 may be described as a sample stage 120.

The wafer placing electrode 120 has an upper surface 120*b* coated with a dielectric film 140 forming the placing surface 120*a*. Inside the dielectric film 140, a plurality of conductor films for electrostatic adsorption (electrostatic adsorption electrodes) 111 are disposed while being connected to a DC power source 126 via a high frequency filter 125 shown in FIG. 1.

The conductor film 111, forming the placing surface 120*a* of the sample stage 120, is a film electrode for electrostatic adsorption, into which DC power is supplied for electrostatic adsorption of a semiconductor wafer by static electricity. In this case, although the conductor film 111 may be a bipolar film, in which one of the film electrodes is given a different polarity from another one or may be a unipolar film, in which the electrodes are given the same polarity, the conductor film 111 is shown as a unipolar film in this embodiment.

A high-frequency power source (first high-frequency power source) 124 and a matching device 129 are disposed at a location closer to the electrostatic adsorption electrode (conductor film 111) than the high-frequency filter 125, and these high-frequency power source 124 and matching device 129 are connected to a circular or cylindrical conductor-made electrode substrate 108 disposed inside the wafer placing electrode 120. The high-frequency power source 124 is connected to ground 112. The electrode substrate 108 may be simply referred to as a substrate 108 below.

High-frequency power of a predetermined frequency (first high-frequency power) is supplied from the high-frequency power source 124 to the electrode substrate 108, and during processing of a wafer 109, a bias potential is formed above the wafer 109 that is adsorbed to and held on the upper surface of the wafer placing electrode 120. In other words, the sample stage has the wafer placing electrode 120 to which the high-frequency power (first high-frequency power) is supplied from the high-frequency power source 124 during generation of the plasma 116.

Inside the electrode substrate 108, a refrigerant flow path 152 is disposed spirally or concentrically around the vertical central axis of the electrode substrate 108 or wafer placing electrode 120 so as to remove transferred heat and cool the wafer placing electrode 120. A refrigerant for cooling the electrode substrate 108 flows through the refrigerant flow path 152.

Further, on the peripheral side of the upper part of the wafer placing electrode 120, a recessed part 120*d* is provided so as to surround the upper part on the peripheral side of the placing surface 120*a*. A susceptor ring 113, which is a ring-like component made of a dielectric material such as quartz or ceramics including alumina, is disposed on a ring-like upper surface, which is formed to be lower in height than the placing surface 120*a* of the sample stage, of the recessed part 120*d*.

While being placed on the recessed part 120*d*, the upper surface of the susceptor ring 113 has a height dimension larger than the placing surface 120*a* of the wafer placing electrode 120. The susceptor ring 113 is disposed on the outer periphery of the placing surface 120*a* of the wafer placing electrode (sample stage) 120, and covers the surface of the wafer placing electrode 120. Specifically, the susceptor ring 113 is configured to cover the upper surface of the recessed part 120*d*, the cylindrical sidewall surface of the recessed part 120*d*, and the cylindrical sidewall surface of the wafer placing electrode 120 below the recessed part 120*d*.

In such a plasma etching apparatus 100, in a vacuum transfer chamber that is reduced in pressure to the same pressure as the processing chamber 104 inside a vacuum transfer container, which is another vacuum container connected to the sidewall of the vacuum container 101, an unprocessed wafer 109 is placed on an arm tip end of a wafer transfer robot disposed within the vacuum transfer chamber. A gate, which is a passageway communicating between the vacuum transfer chamber and the processing chamber 104, is then opened by action of a valve disposed in the vacuum transfer chamber, and the unprocessed wafer 109 is transferred into the processing chamber 104 while being placed on the arm tip end of the robot. Further, the wafer 109, which has been transferred to above the placing surface 120*a* of the wafer placing electrode 120 in the processing chamber 104, is passed onto a lift pin by vertical movement of the lift pin, and placed on the placing surface, and then adsorbed to and held on the placing surface 120*a* of the wafer placing electrode 120 by electrostatic force generated by DC power applied from the DC power source 126.

In this state, an etching gas is introduced into a gap space between the dielectric window 103 and the quartz shower plate 102 while being adjusted in flow rate or speed by a mass flow controller (not shown), and diffused in the space, and then introduced into the processing chamber 104 through the gas introduction holes 102*a* of the shower plate 102. Thereafter, gases and particles inside the processing chamber 104 are exhausted through the vacuum exhaust port 110 by operation of the vacuum exhaust device. Depending on balance between the amount of the gas supplied from the gas introduction holes 102*a* of the shower plate 102 and the amount of exhaust from the vacuum exhaust port 110, the inside of the processing chamber 104 is adjusted to a predetermined value within a range suitable for processing of the wafer 109.

While the wafer 109 is adsorbed and held, a heat-conductive gas such as helium (He) is supplied into a gap between the wafer 109 and the upper surface of the dielectric film 140, which is the placing surface 120*a* of the wafer placing electrode 120, from an undepicted opening in the upper surface of the dielectric film 140, resulting in promotion of heat transfer between the wafer 109 and the wafer placing electrode 120. A refrigerant, having a temperature adjusted within a predetermined range, flows through and circulates within a refrigerant flow path 152 disposed in the electrode substrate 108 of the wafer placing electrode 120, thereby temperature of the wafer placing electrode 120 or the electrode substrate 108 is pre-adjusted before the wafer 109 is placed. Consequently, through the heat transfer to and from the wafer placing electrode 120 or the electrode substrate 108, which has a large heat capacity, temperature of the wafer 109 is adjusted to be close to the temperature of the electrode 120 or the electrode substrate 108 before processing, and the temperature of the wafer 109 is also adjusted by heat transfer from the wafer 109 after start of the processing.

In this state, the electric field and magnetic field of the microwave are supplied into the processing chamber 104, and the plasma 116 is generated with the gas. When the plasma 116 is generated, radio frequency (RF) bias power is supplied to the electrode substrate 108 from the high-frequency power source 124, and a bias potential is generated above the upper surface of the wafer 109, and charged particles such as ions in the plasma 116 are attracted to the upper surface of the wafer 109 depending on a potential difference between the bias potential and a potential of the plasma 116. Further, the charged particles collide with a surface of a film layer to be processed of the film structure including a beforehand disposed mask and the film layer to be processed on the upper surface of the wafer 109, so that etching processing is performed. During the etching processing, the processing gas introduced into the processing chamber 104 and the reaction product particles generated during the processing are exhausted from the vacuum exhaust port 110. In the plasma etching apparatus 100, during the plasma processing, a second high-frequency power is supplied from a high-frequency power source (second high-frequency power source) 127 via a power supply connector 161 described later, which is provided on the sample stage and includes an elastic conductive component, to a conductor ring (second electrode) 131 disposed at the upper part of the outer periphery of the sample stage.

In the wafer placing electrode 120, AC high voltage generated by the high-frequency power source (second high-frequency power source) 127 is introduced into the conductor ring (second electrode) 131 made of an electrical conductor disposed in the susceptor ring 113 via a load matching box 128 and a load impedance variable box 130. According to this configuration, a value of impedance against the high-frequency power is made relatively low in a range from the high-frequency power source 127 to the peripheral edge of the wafer 109 through the electrode substrate 108 by a combination of the load impedance variable box 130 adjusted to a suitable impedance value and the relatively high impedance portion disposed in the upper part of the susceptor ring 113. As a result, the high-frequency power is effectively supplied to the peripheral portion and the peripheral edge of the wafer 109, and thus electric field concentration on the peripheral portion or the peripheral edge can be relieved so that charged particles such as ions in the plasma are attracted to the upper surface of the wafer 109 in a desired direction.

A high-frequency power source 127 is connected to the ground 112. Frequency of the high-frequency power source 127 is preferably set to the same as or a constant multiple of the frequency of the high-frequency power source 124.

Figure 2:
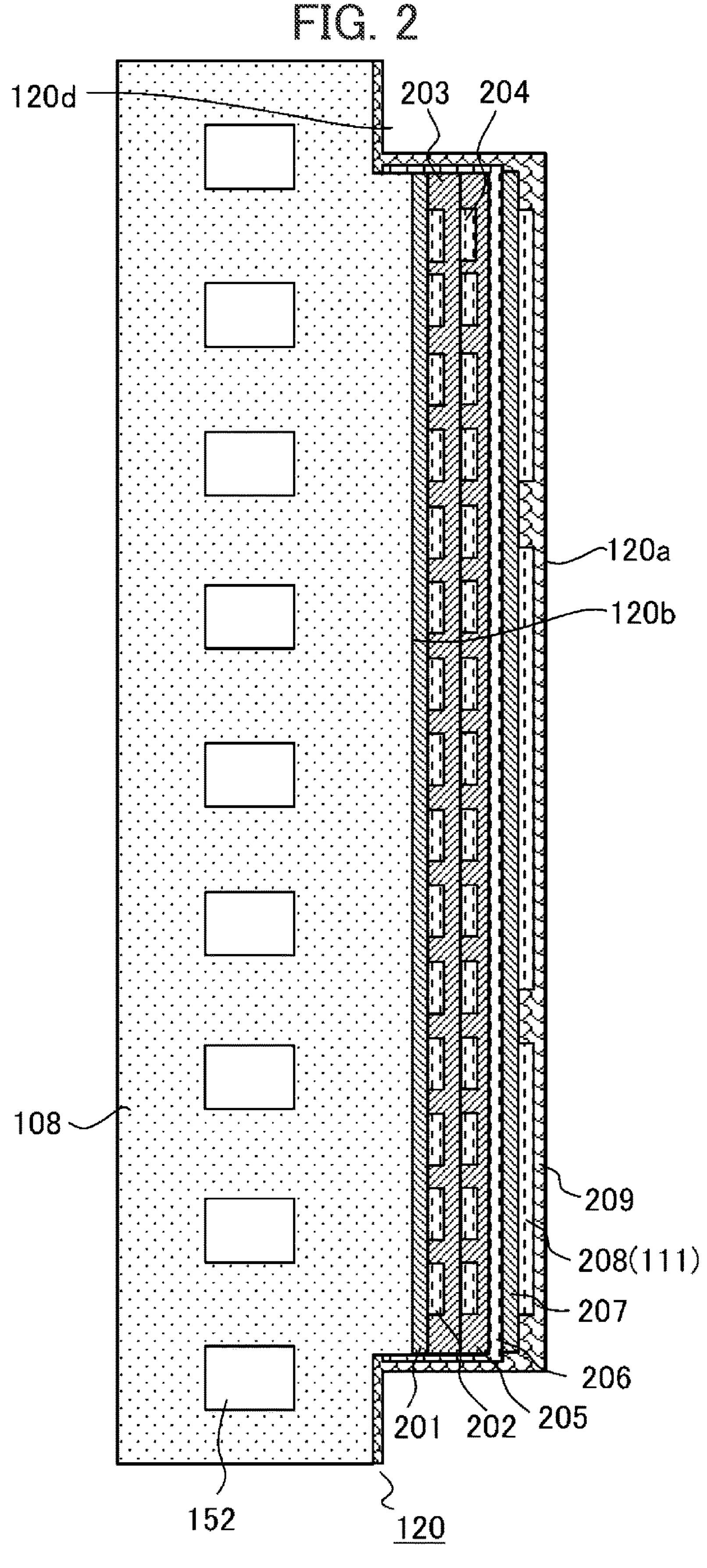
FIG. 2 is a cross sectional diagram schematically illustrating part of a configuration of a sample stage of the plasma processing apparatus shown in FIG. 1.
Figure 3:
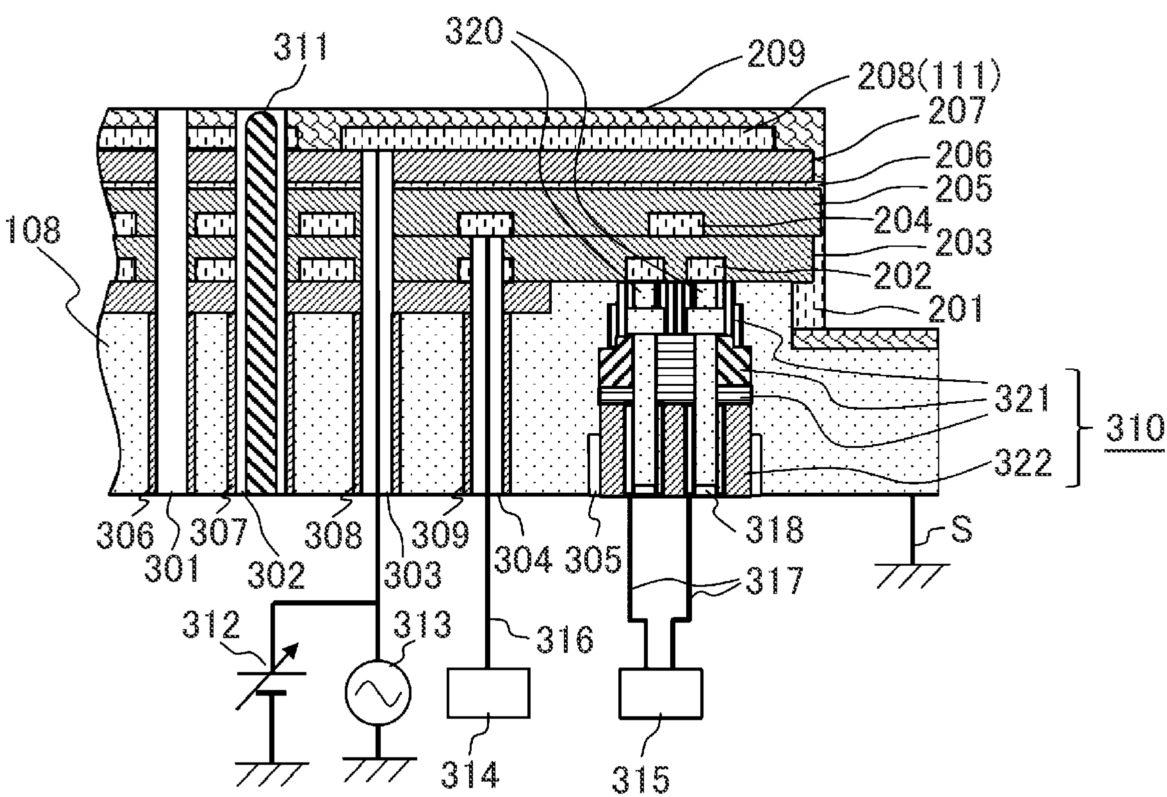
FIG. 3 is a partially expanded, cross sectional diagram schematically illustrating part of the configuration of the sample stage of the plasma processing apparatus as shown in FIG. 2.

A configuration of the sample stage 120 according to this embodiment is now described in detail with reference to FIGS. 1, 2, and 3. FIG. 2 is a cross sectional diagram schematically illustrating part of a configuration of the sample stage of the plasma processing apparatus shown in FIG. 1. FIG. 3 is an enlarged partial sectional diagram schematically illustrating part of the configuration of the sample stage of the plasma processing apparatus shown in FIG. 2.

The disc-like or cylindrical substrate 108, which is disposed inside the sample stage 120 shown in FIG. 2, is made of metal material such as titanium, aluminum, or a compound of such a metal, and is electrically connected to a ground electrode S and coupled to a wall surface of the vacuum container 100 shown in FIG. 1 in a conductible manner, and is thus fixed to the ground potential. The substrate 108 has a convex part, on which the wafer 109 is placed, in its central portion, and a concave part disposed in a ring shape on the peripheral side of the convex part, surrounding the convex part, and having an upper surface low in height.

A step forming an outer-circumferential sidewall of the convex part is provided between the convex part and the concave part. As described above, the susceptor ring 113 made of a ceramic material is placed on the ring-like concave part.

A dielectric film 201 made of a dielectric material such as ceramics is disposed on a flat upper surface of the convex part of the substrate 108. Further, on the film layer of the dielectric film 201, a plurality of first heater films (also referred to as first heater layer) 202, each of which is a film electrode made of a conducive material and generates heat when DC power is supplied thereto, are disposed to cover a plurality of regions of the upper surface of the substrate 108. In other words, the dielectric film 201 is disposed on the upper surface of the substrate 108, and the heater films 202 being the film heaters are formed on the dielectric film 201.

The heater film 202 is further covered with a dielectric film 203 as an upper layer, and the periphery of the heater film 202 is enclosed by a dielectric component (dielectric film 203). In the sample stage 120, a plurality of second heater films (also referred to as second heater layer) 204, each of which is a film electrode made of a conductive material having the same structure as described above and generates heat when DC power is supplied thereto, are disposed as an upper layer on the dielectric film 203, which covers the heater films 202 disposed on the dielectric film 201, to cover a plurality of regions of the upper surface of the substrate 108.

Further, a dielectric film 205 is disposed so as to cover the heater film 204. In other words, the first heater film 202 enclosed by the dielectric films 201 and 203 is disposed on the upper surface 120*b* of the substrate 108, and the second heater film 204 enclosed by the dielectric films 203 and 205 is further disposed over the upper surface of the first heater film 202 in the same way as above.

Each of the plurality of heater films 202 or 204 is connected via a power supply cable (power supply line, power supply path) 316 or 317 to a DC power source 314 or 315 whose operation is adjusted according to a command signal from a controller, and is thus configured to allow DC power to be supplied thereto by the DC power source 314 or 315. In other words, the power supply cable 316 or 317 electrically connects the heater film 202 or 204 to the DC power source 314 or 315 that supplies DC power to the heater film 202 or 204. However, the power supply cable 316 or 317 includes no filter for high-frequency power.

In this way, the inside of the dielectric film 201 disposed on the upper surface 120*b* of the sample stage 120 includes the plurality of first heater films 202 (referred to as multi-zone heater) that can adjust a calorific value and in turn temperature of the upper surface of the dielectric film 201 for each region (zone) and includes the plurality of second heater films 204, which can adjust the temperature of the upper surface, over the first heater films 202.

In the sample stage 120, the first heater film 202 enclosed by the dielectric films 201 and 203 is disposed on the upper surface 120*b* of the substrate 108, and the second heater film 204 enclosed by the dielectric films 203 and 205 is disposed on the upper surface of the first heater film 202 in the same way as above. Further, a shield film 206, which is a film-like conductive component disposed to enclose the upper side and the outer circumference of the periphery of the dielectric film 205, is provided on the upper surface of the dielectric film 205, resulting in a structure where the heater films 202 and 204 are enclosed by (covered with) the shield film 206. In other words, the structure, in which the heater films 202 and 204 are enclosed by the shield film (conductor film) 206, is encapsulated by the dielectric material forming part of each of the dielectric films 201, 203, and 205. The shield film 206 is electrically connected to the substrate 108, thereby the shield film 206 can be fixed to the ground potential as with the substrate 108, resultantly making it possible to suppress inflow of a high-frequency wave into the heater films 202 and 204.

Further, a dielectric film 207 is disposed on the upper surface of the shield film 206, and over such a dielectric material component, an electrode 111 for electrostatic adsorption and an electrode film 208, to which high frequency power for forming a high frequency bias is supplied, are disposed. In other words, the electrode film 208 is made of a conductive material, and is electrically connected to a high-frequency bias power source 313 that supplies high-frequency power of a predetermined frequency. A DC power source 312 is also electrically connected to the electrode film 208, making it possible to adsorb the wafer 109, which is placed on the placing surface of the sample stage 120, by static electricity when DC voltage is applied to the electrode film 208. The DC power source 312 corresponds to the DC power source 126 in FIG. 1.

Above the upper surface of the electrode film 208, a dielectric film (electrostatic adsorption component) 209 made of a ceramic material, which forms the uppermost surface of the sample stage 120, i.e., a placing surface on which the wafer 109 is placed, is disposed to cover the upper surface of the convex part, the concave part around the convex part, and the step being the sidewall of the convex part. In other words, on the uppermost surface of the sample stage 120, the dielectric film 209, which includes the electrode film (electrode) 208 disposed on the shield film 206 to adsorb the wafer 109 by electrostatic force, is disposed on the shield film 206. The dielectric film 140 in FIG. 1 can be considered as the dielectric films 201, 203, 205, 207, and 209 in this example.

As illustrated in FIG. 3, the sample stage 120 has a plurality of through holes (301, 302, 303, 304, 305) that penetrate between the upper surface of the dielectric film 209 on the convex part and the bottom surface of the substrate 108. These through holes include a plurality of lift-pin through holes 302 that house lift pins (pins) 311 that move up and down to support the wafer 109 from below and move the wafer 109 above the upper surface of the sample stage 120, and a heat-conductive gas supply holes 301 through which a heat-conductive gas such as He flows, which is supplied to a gap between the upper surface of the dielectric film 209 and the back surface of the wafer 109 placed on the upper surface. The lift pin 311 disposed in the lift-pin through hole 302 is used to raise or lower the wafer 109 above the upper surface of the dielectric film 209.

The lift-pin through holes 302 open on the upper surface of the dielectric film 209, and pass through the dielectric film 201, the dielectric film 203, the dielectric film 205, and the dielectric film 206. An electrostatic adsorption power supply hole 303 inside which a power supply cable for applying power to the electrode film 208 and a connector are disposed, a heater power supply hole 305 in which power supply paths 317 for supplying power to the first grid-like heater film 202 and a connector are disposed, and a heater power supply hole 304 in which a power supply cable 316 for supplying power to a second ring-like heater film 204 and a connector are disposed inside the sample stage 120.

Insulating bosses 306, 307, 308, 309, and 310, which are each a cylindrical component made of a dielectric material or an insulating material, are disposed respectively on the inner circumferential wall surfaces of portions, which penetrate the inside of the substrate 108, of the holes (301, 302, 303, 304, 305). In other words, the substrate 108 of the sample stage 120 has the insulating bosses 306, 307, 308, 309, and 310 being cylindrical components made of an insulating material, each of which forms the inner circumferential wall surface of the substrate 108 inside the substrate 108 and is disposed inside each of the through holes.

The insulating bosses 306, 307, 308, 309, and 310 can each suppress generation of discharge in a space inside the hole, which is exposed to an electric field due to high-frequency power during processing of the wafer 109. Ceramic materials such as alumina and yttria and resin materials can be used as a material to form the insulating bosses 306, 307, 308, 309, and 310.

In particular, in this embodiment, a plurality of power supply paths to supply power to the plurality of heater films 202, and an insulating connector 310 made of a dielectric material and enclosing the power supply paths to insulate each power supply path are disposed in the heater power supply hole 305. The insulating connector 310 is formed with a plurality of cylindrical components connected in the vertical direction, in each of which a component made of a conductive material such as metal is disposed to form a power supply path. Further, a lower insulating connector 322, which is at least the lowest component among the insulator components forming the insulating boss, is configured to be attachable/detachable (mountable and removable) to/from the bottom (bottom surface) of the substrate 108. The lower insulating connector 322 has a cylindrical shape and is configured to be attached to or detached from the bottom of the substrate 108 so that a power supply path for supplying power to the first grid-like heater film 202 is established or disconnected. The lower insulating connector 322 can be rephrased as a power supply connector for supplying power to the heater film 202.

The lower insulating connector 322 is inserted into the heater power supply hole 305 from below, so that the bottom surface (lower end) of the upper insulating connector 321 made of an insulator such as ceramics disposed at the upper side of the inside of the heater power supply hole 305 faces or is in contact with the upper surface (upper end) of the lower insulating connector 322. In this state, a lower part of each of a plurality of power supply pins 320 passing through the central portion of the upper insulating connector 321 is inserted into one of a plurality of insertion holes 318 disposed at the central portion of the lower connector 322. In the state where the lower part of each of the power supply pins 320 is inserted into each insertion hole 318 of the lower insulating connector 322, the lower part of the power supply pin 320 is fitted in contact with a terminal made of a conductor within the insertion hole 318. This fixes a vertical position of the lower insulating connector 322. The insertion hole 318 can be rephrased as a through hole.

In this example, the upper insulating connector 321 is configured of three components (an upper insulating sleeve, a threaded sleeve, and a lower insulating sleeve) combined vertically. The uppermost upper insulating sleeve forming the upper insulating connector 321, in which each power supply pin 320 is inserted into the central portion of the upper insulating sleeve, is inserted into the upper end inside the heater power supply hole 305 of the substrate 108 while the power supply pin 320 is held, and is fixed in position with adhesive. In this state, a position of the power supply pin 320 is also fixed. For example, a ceramic-based adhesive can be used as the adhesive, and the upper insulating sleeve and the heater power supply hole 305 are vacuum-sealed with the ceramic-based adhesive. Thereafter, the dielectric film 203 and the heater film 202 are formed by thermal spraying. The power supply pin 320 is made of a cylindrical rod-like conductive component. The upper end of the power supply pin 320 is configured to be connected to the bottom surface of the first heater film 202 formed on the dielectric film 203.

The upper insulating sleeve is inserted into the heater power supply hole 305 (while the plurality of power supply pins 320 are held in the central portion of the upper insulating sleeve), and the cylindrical threaded sleeve made of an insulator is inserted into the heater power supply hole 305 while the upper insulating sleeve is joined to the upper part of the heater power supply hole 305. Further, the threaded sleeve is screwed so that a screw formed in advance on the cylindrical sidewall surface engages with a screw formed on the inner circumferential sidewall surface of the heater power supply hole 305. The threaded sleeve is screwed until the upper end of the threaded sleeve comes into contact with the bottom surface (lower end) of the upper insulating sleeve, thereby the upper insulating sleeve is supported from below by the threaded sleeve.

Further, the cylindrical lower insulating sleeve is inserted into the heater power supply hole 305 until the upper end of the lower insulating sleeve comes into contact with the bottom surface (lower end) of the threaded sleeve. An insulating adhesive is then placed for bonding between the cylindrical side surface of the lower insulating sleeve and the inner circumferential sidewall surface of the heater power supply hole 305. For example, a silicone adhesive can be used as the insulating adhesive. In this state, the lower insulating connector 322 is inserted into the heater power supply hole 305 from below. The power supply pin 320 is then inserted into each through hole 318 that is disposed at a position axially symmetrical about the vertical axis in a central region of the circular upper surface of the lower insulating connector 322. The power supply pin 320 then comes into contact with a connector terminal made of a conductor disposed inside each through-hole 318.

Each of the connector terminals inside the plurality of through holes 318 of the lower insulating connector 322 is connected to a DC power source 315 via each power supply path 317. The substrate 108 connected to the ground electrode S is insulated from the power supply path 317 and the power supply pin 320 by the upper insulating connector 321, the adhesive (silicone adhesive in this example), and the lower insulating connector 322. Further, the processing chamber 104 is airtightly partitioned from the interior of the heater power supply hole 305 made to have atmospheric pressure or a pressure approximate to the atmospheric pressure by the adhesive (ceramic-based adhesive in this example) to join the upper insulating connector 321 and the substrate 108.

Devices that adjust operation of the plasma etching apparatus 100, including: devices configuring an electric field/magnetic field adjustment system including the electric-field generation power source 106, a magnetic field generation coil 107, the high-frequency power source 124, the high frequency filter 125, the DC power source 126, the high-frequency power source 127, the matching boxes 128 and 129, and the load impedance variable box 130; and the DC power sources 314 and 315 that supply power to the first heater film 202 and the second heater film 204 inside the dielectric film 201, or including devices configuring a pressure adjustment system including a vacuum evacuation device and a mass flow controller that adjusts gas supply, etc., as described later, each include a detector that detects operating conditions such as output power, flow rate, pressure, etc., or a plurality of temperature sensors disposed inside the substrate 108 of the wafer placing electrode 120, and are each connected communicably to the control unit 170 in a wired or wireless manner.

When a signal indicating an operating state of each of the devices output from the detector provided in each device is transmitted to the control unit 170, a computing unit of the control unit 170 reads software stored in the internal storage device of the control unit 170 and detects the amount of the state from the signal received from the detector based on the algorithm of the software, and calculates a command signal to adjust the amount to an appropriate value and transmits the command signal. When each of the devices included in the electric field/magnetic field adjustment system, the DC power sources 314 and 315, or the pressure adjustment system receives the command signal, the device adjusts its operation according to the command signal.

Figure 4:
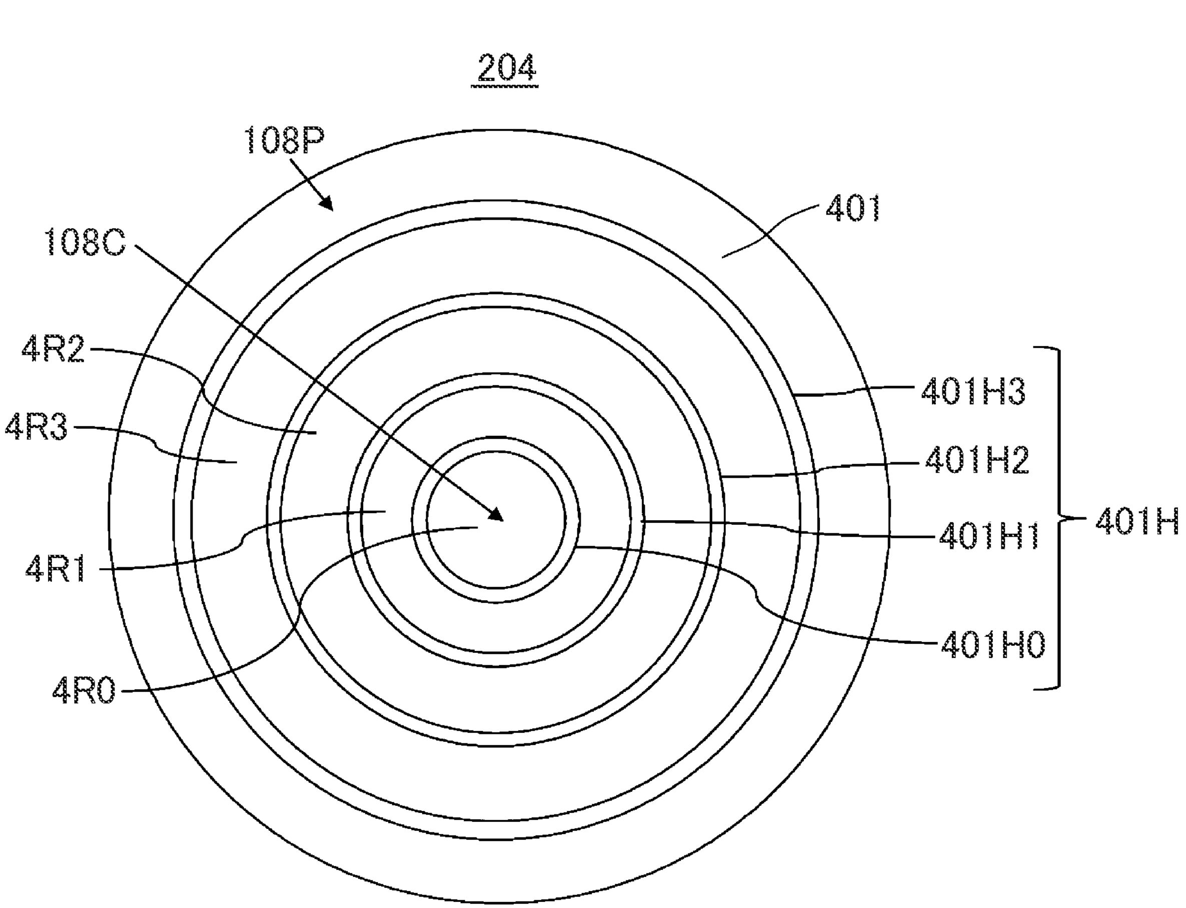
FIG. 4 illustrates an example of a second heater in the sample stage according to the embodiment.

FIG. 4 illustrates one example of layout of the second heater films in the sample stage. The heater layout 401 shown in FIG. 4 is one example of layout of a plurality of second ring-like heater films 204 inside the sample stage 120. Each heater film 204 has a heater wire inside in order to perform temperature control during plasma processing of the wafer 109 according to reaction product distribution and plasma density distribution.

A second heater layer 204 includes a plurality of film heater parts 401H (401H0, 401H1, 401H2, 401H3). The film heater parts 401H (401H0, 401H1, 401H2, 401H3) are disposed in three or more respective radial regions (4R0, 4R1, 4R2, 4R3) including circular regions concentrically disposed around the center and a ring-like region surrounding the outer periphery of the circular regions inside the dielectric films (dielectric films 203, 205), above the first heater layer 202, and on a plurality of radii in the radial direction from the center (108C) of the upper surface of the substrate 108 of the sample stage 120 toward the outer periphery (108P).

Figure 5:
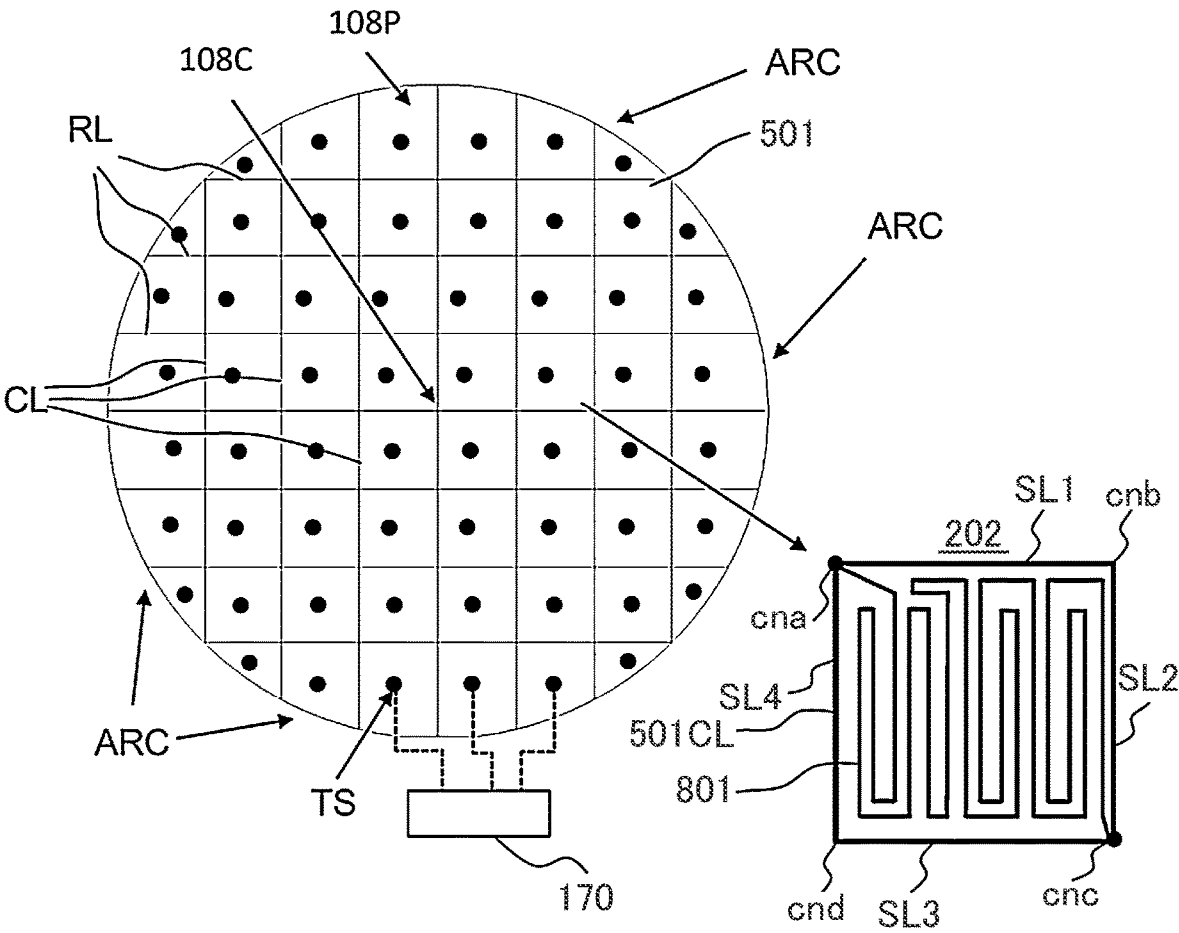
FIG. 5 illustrates an example of a first heater in the sample stage according to the embodiment.

FIG. 5 illustrates an example of layout of the first heater films provided on the sample stage of the plasma processing apparatus according to this embodiment. The film-like, first heater films 202 in this embodiment are each a metal-made film heater disposed inside a dielectric film 140 that includes multiple layers and covers the circular, upper surface of the substrate 108, and are each disposed in one of a plurality of regions 501 corresponding to respective circuit patterns of a plurality of semiconductor devices formed in advance on the upper surface of the wafer 109 placed on the upper surface of the dielectric film 209 as viewed from above. In the substrate 108 of the circular sample stage 120, at the peripheral edge of the upper surface of the dielectric film 201, the region 501 does not have a completely rectangular shape but partially has an arcuate shape ARC.

The first heater film 202 is provided to adjust temperature of each circuit pattern (also referred to as a die or chip region) of a semiconductor device formed on the wafer 109 during plasma processing.

For example, as shown in FIG. 5 in an enlarged manner, in a rectangular region 501, the first heater film 202 includes: an outer frame wiring part 501CL having a rectangular shape; and an internal wiring part 801 formed inside the outer frame wiring part 501CL. The internal wiring part 801 is, for example, connected between a pair of opposing corners (first corner cna, third corner cnc) among four corners (first corner cna, second corner cnb, third corner cnc, fourth corner cnd) of the outer frame wiring part 501CL. The pair of corners (cna, cnc) are diagonal corners.

The internal wiring part 801 is a film heater wire, and for example, is configured of meandering heater wiring (also referred to as meander wiring) between a pair of opposing corners (cna, cnc) of the outer frame wiring part 501CL so that the inner region of the outer frame wiring part 501CL can be entirely heated. The outer frame wiring part 501CL has a first side SL1 provided between the first corner cna and the second corner cnb, a second side SL2 provided between the second corner cnb and the third corner cnc, a third side SL3 provided between the third corner cnc and the fourth corner cnd, and a fourth side SL4 provided between the fourth corner cnd and the first corner cna. The first side SL1 and the third side SL3 are provided opposite to each other, the second side SL2 is provided between the first side SL1 and the third side SL3, and the fourth side SL4 is provided opposite to the second side SL2.

The outer frame wiring part 501CL of the first heater film 202 is made to have a rectangular shape in accordance with the outer shape of each region 501 as viewed from above inside each of the plurality of rectangular regions 501 obtained by dividing the upper surface of the dielectric film 201 into grid shapes in correspondence to a shape of the die of the semiconductor device by a plurality of parallel first lines (RL) extending in the longitudinal direction at equal intervals and a plurality of second lines (CL) that are perpendicular to the first lines (RL) and extend in the longitudinal direction at equal intervals. At the peripheral edge of the upper surface of the dielectric film 201, since the region 501 does not have a completely rectangular shape but partially has the arcuate shape ARC, the outer frame wiring part 501CL correspondingly has a shape in accordance with the outer shape of the region 501 of the arcuate shape ARC (see FIG. 6 for this).

The number of regions 501 of the first heater film 202 is larger than the number of regions (4R0, 4R1, 4R2, 4R3 in this example) of the heater layout 401 of the plurality of ring-like second heater films 204 shown in FIG. 4. The number of regions (in this example, 4R0, 4R1, 4R2, 4R3) of the heater layout 401 is, for example, 3 to 40, while the number of regions 501 can be made to be, for example, 10 to 200. Inside each region 501, a narrow metal-made thin film forming the first heater layer 202 is folded horizontally multiple times along the sides of the rectangular outer shape, so that a rectangular film heater wire (801) is disposed.

Power, which is supplied to each of the plurality of film heaters (801) formed along the shape of the region 501 corresponding to the die of the semiconductor device during plasma processing, is adjusted, thereby temperature of the wafer 109 can be adjusted accurately for each location corresponding to each die of the semiconductor device on the upper surface of the wafer 109. In particular, the temperature is adjusted for individual dies of a manufactured semiconductor device, making it possible to reduce variations in results of the etching processing on the wafer 109. In this configuration, thickness of each of the film heaters formed by the second heater layer 204 is larger (thicker) than thickness of each of the film heaters 801 formed by the first heater layer 202.

For each heater zone (501) of the first heater film 202 corresponding to the die of the semiconductor device on the wafer 109 as shown in FIG. 5, a plurality of temperature sensors TS are disposed inside the substrate 108 below the respective heater zones. The temperature sensors TS are electrically connected to the control unit 170, for example, by metal wiring, and the temperature values measured and detected by the temperature sensors TS are transmitted to the control unit 170 via the metal wiring.

When receiving output from the temperature sensor TS, the control unit 170 detects temperature of the upper surface of the substrate 108 or the surface of the dielectric film 201 corresponding to each zone (501) according to the software algorithm stored in a storage device inside the control unit 170. Further, the control unit 170, based on the detected temperature, adjusts the amount of DC power supplied to the heater wire (801) in each zone (501) according to the similarly read software algorithm, and adjusts a calorific value of the heater wire (801) in each zone (501) or the heating amount on the substrate 108. In other words, the control unit 170 is configured to perform feedback control based on the detected temperatures corresponding to the output from the temperature sensors TS so that the calorific value of the film heater wire (801) forming the first heater layer (202) in each zone (region 501) or the heating amount on the substrate 108 matches a desired calorific value or desired heating amount.

The heater wire (801) subjected to feedback control is the first heater film 202. The second heater film 204 is maintained in a predetermined amount of power supplied to the heater in each ring-like zone (4R0, 4R1, 4R2, 4R3) including a series of circular or arcuate regions shown in FIG. 4 for each wafer 109 or for each type of film structure on the upper surface of the wafer 109, or for each batch (lot) of a predetermined number of wafers 109. That is, in plasma processing of any wafer 109, the calorific value of the second heater film 204 is fixed, and temperature of the first heater film 202 (heater wire 801) is adjusted according to the temperature obtained from the output from the temperature sensor TS. In other words, the control unit 170 adjusts the output of the film heater 801 disposed within one of the rectangular regions (region 501 and CH1 to CH4 in FIGS. 7 and 8) in the first heater layer 202 depending on the output from the plurality of temperature sensors TS while maintaining output of the heater in the second heater layer 204 located above one of the rectangular regions (region 501 and CH1 to CH4 in FIGS. 7 and 8) corresponding to the dies of the semiconductor device.

Figure 6:
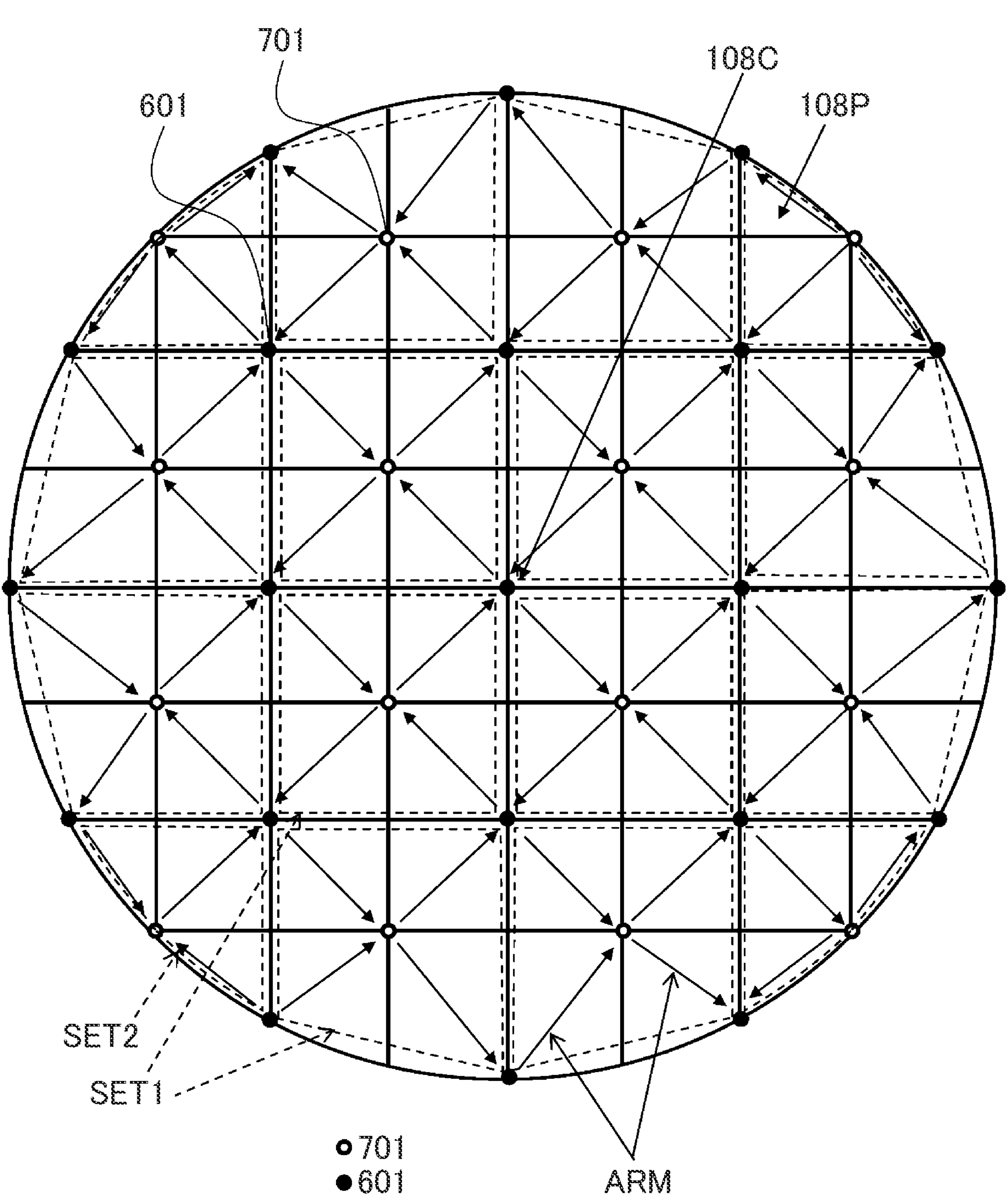
FIG. 6 is a layout diagram of a power supply part and a return part of a grid heater according to the embodiment.

A method for disposing a current supply part (601, hereinafter also referred to as power supply part) and a return location (701, hereinafter also referred to as current return part) of a first grid-like heater (first heater film 202) in this embodiment is now described with reference to FIG. 6. FIG. 6 is a top diagram schematically illustrating layout of the first heater films 202 disposed in a plurality of grid-like regions on the sample stage according to this embodiment shown in FIG. 5, and illustrating layout of the power supply parts (601) and the current return parts (701) for the respective first heater films 202. FIG. 6 shows a layout example of the grid heaters (first heater films 202), and a layout example of the power supply parts (601) and the current return parts (701).

This layout method has the following features.

1) A connector portion of either the supply part (601) or the return location (701) (white circle: connection region of the return location (701), black circle: connection region of the supply part (601)) is disposed at each of the two diagonal corners of each rectangular grid.

2) A set of four grid-like regions 501, in which each region 501 is adjacent to two regions belonging to the set while the respective one sides of the rectangles adjacently face each other in the longitudinal direction (vertical direction in the figure) and in the lateral direction (lateral direction in the figure), is defined as one set (SET1), and one current return part 701 and four power supply parts (also referred to as power supply paths) 601 are provided for each set (SET1). Specifically, the four grid-like regions 501 configure a region having a rectangular shape as a whole, with two regions 501 stretched in the longitudinal and lateral directions, the current return part (also referred to as a return path) 701 is disposed at the corner of each of the four grid-like regions 501 and at the center of the entire region, and the power supply part 601 in each region 501 is disposed at a corner diagonal to the corner where the current return part 701 is disposed.

Figure 7:
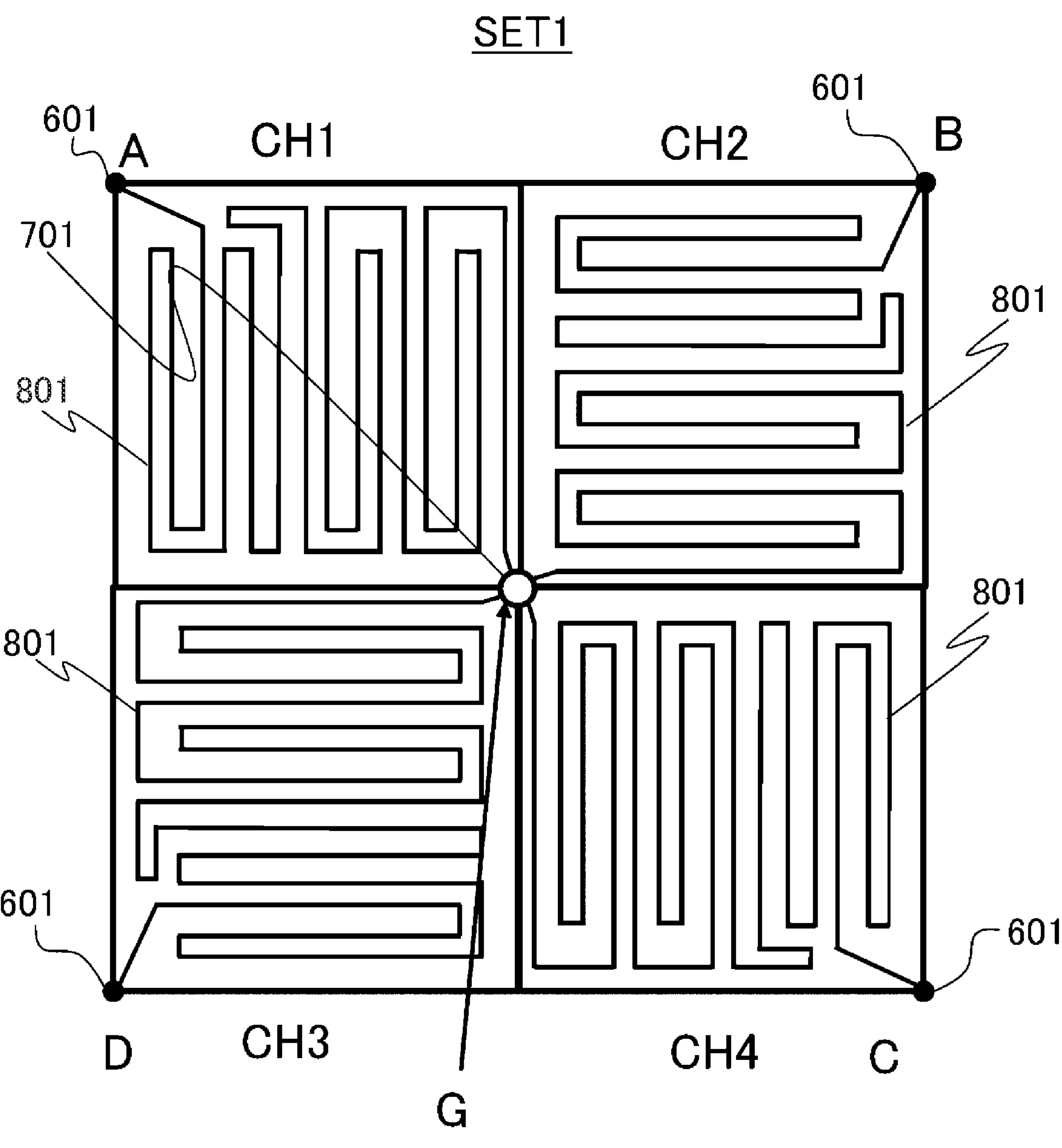
FIG. 7 is an enlarged view of a set of four grid heaters according to the embodiment.

That is, as shown in FIG. 7 described later, in one set (SET1) including four grids (one grid corresponds to the region 501), the current return part (701) is disposed in the central portion, and the power supply part (601) is disposed at each of the four corners. In other words, four film heaters 801 disposed in the four respective regions (CH1 to CH4) are defined as one set, and four power supply paths (power supply parts 601) that are each electrically connected to one location (A, B, C, D) of one of the film heaters 801 of this set and supply power from the DC power source 315, and one return path (701) that is electrically connected to another location (G) of each film heater 801 to return power to the DC power source 315 are provided. That is, in this configuration, one return path (701) is electrically connected to each of the ends of the film heaters 801 disposed in the plurality of adjacent regions (CH1 to CH4), and the supplied power is returned to the DC power source 315 via the respective ends of the heaters 801 and the substrate 108.

3) As a result, for the first heater film 202 in each region 501, current flows from the point connected to the connector of the power supply part 601 disposed at the corner of each of the four regions 501 toward the central portion or the center of the region (SET1) of the entire set of the four regions 501. In other words, as shown by arrows in FIG. 6, the current flows from the four corners (corners at each of which the power supply part 601 is disposed) to the central portion (portion at which the current return part 701 is disposed), or the current flows from the corner (power supply part 601) to the center (current return part 701), or the current flows from the central portion (current return part 701) to the corner (power supply part 601).

4) On the boundaries between the grids, which partition the regions 501 disposed in a grid pattern, in the longitudinal and lateral directions, the connector portions of the power supply parts 601 and the connector portions of the current return parts 701 are disposed alternately at each boundary (corner) of the two regions 501.

5) Each one of the plurality of boundaries, which partition the plurality of regions 501 partitioned into the grids in the longitudinal and lateral directions, is disposed to pass through the center of the upper surface of the circular substrate 108 or dielectric film 203. However, in the peripheral edge of the circular dielectric film 203, since four rectangular regions 501, two of which are adjacent to each other, cannot be configured as one set, three grid-like regions 501 are disposed as one set.

Such a set of regions 501 or first heater films 202 at the peripheral edge may be configured of two or three of them. In other words, at the peripheral edge of the heater, in which the set (SET1) cannot be formed of four grids, the connector portion of the supply part 601 and the connector portion of the current return part 701 are each disposed with a set (SET2) of three grids.

6) The connector portion of the current return part (701) is made of a conductive material and is connected to the substrate 108, which is grounded and electrically set to the ground potential, by tungsten via wiring. This configuration allows the current supplied to the first heater film 202 to flow through the current return part 701 to the substrate 108 set at a certain voltage (ground potential).

The number of through holes (holes), which each accommodate a cable configuring the return path for returning the current supplied to the first heater film 202 to the power source, can be reduced to reduce the number of man-hours and costs for manufacturing the sample stage 120 or the plasma processing apparatus. In other words, the return current flows to the substrate 108, making it possible to reduce the machining number of holes required for the return current in the substrate 108. Via processing is performed on the substrate 108, and tungsten via wiring is formed through the first heater layer 202 and the substrate 108, making it possible to collect the return current of the heater wire 801 in the substrate 108.

A configuration for reversing the polarity of the power supply part 601 of the film heater wire 801, which forms the first heater film 202 inside the set (SET1) of the four regions 501, is now described with reference to FIGS. 7 and 8. FIG. 7 is a top diagram schematically illustrating an outline of the configuration of the first heater film 202 of the set (SET1) of the four regions on the sample stage 120 shown in FIG. 6. The diagram shows the heater wire (801) of the first heater film 202 in each region 501 in an enlarged manner.

Figure 8:
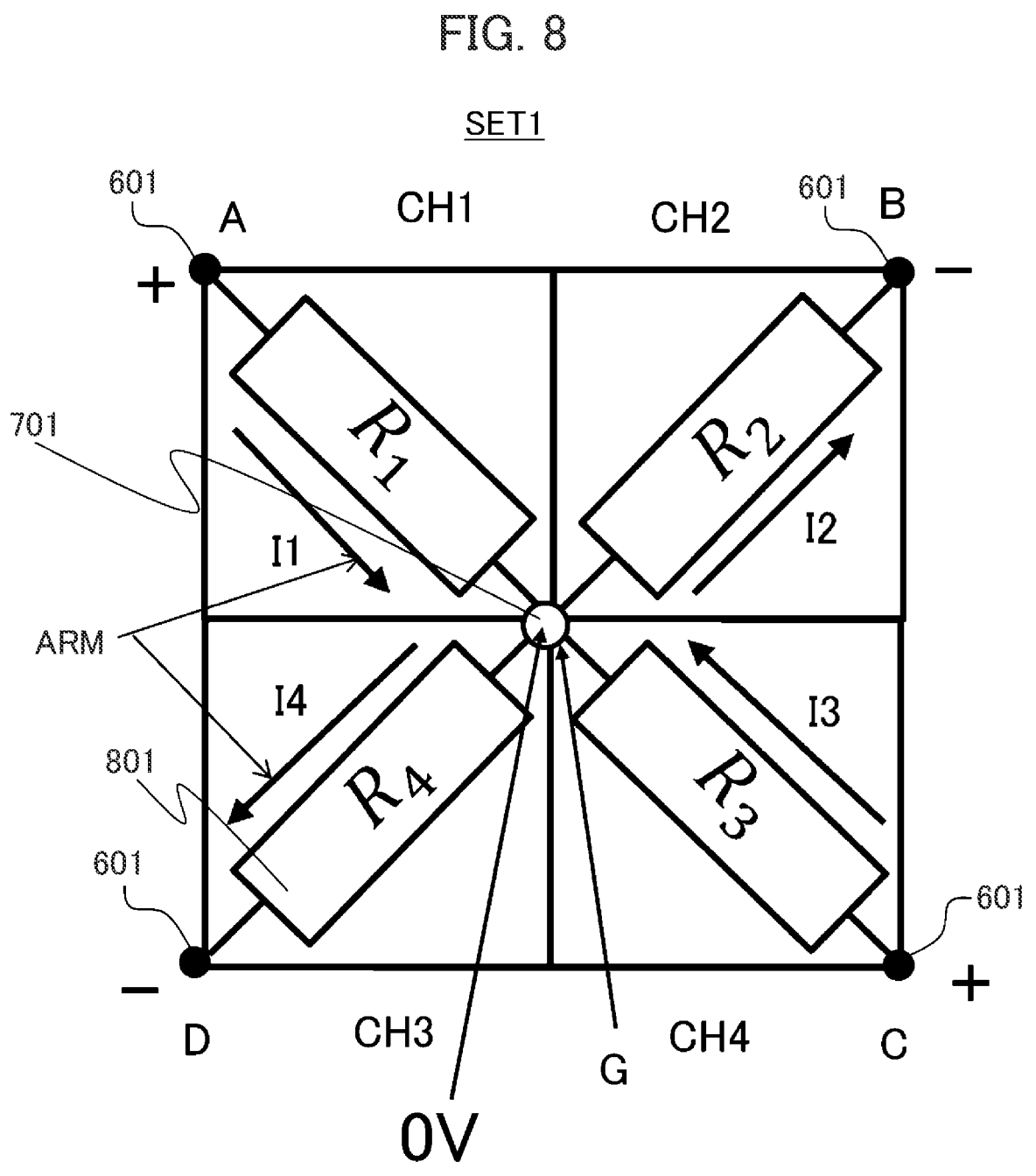

FIG. 8 schematically illustrates the current flowing through the first heater film 202 between the power supply part 601 and the current return part 701 in the four region set (SET1) shown in FIG. 7. FIG. 8 shows an equivalent circuit diagram in which the four heater wires 801 shown in FIG. 7 are rewritten as four resistance elements (R1, R2, R3, R4). FIG. 8 shows the relative magnitude of the potential of the power supply part 601 with respect to the potential of the current return part 701 (ground potential in this embodiment) as a positive or negative polarity. With the positive and negative signs (+, −) and disposition thereof in FIG. 8, the potential of the power supply part (601) is expressed as "+" if it is higher than the potential of the return part 701 and as "−" if it is lower than that.

As illustrated in FIGS. 7 and 8, one set (SET1) includes four grids, and the four grids are configured of four regions (CH1, CH2, CH3, CH4) corresponding to four dies of the semiconductor device. The one set (SET1) has a rectangular shape having four corners (A, B, C, D) and a center point (G) in planar view. The four corners (A, B, C, D) are disposed clockwise in the order of the first corner A, the second corner B, the third corner C, and the fourth corner D in planar view.

The first corner A and the third corner C correspond to the pair of opposing corners. The second corner B and the fourth corner D correspond to another pair of opposing corners.

The first region CH1 is disposed in a rectangular portion between the first corner A and the center point (G). The power supply part 601 is disposed at the first corner A, and the current return part 701 is disposed at the center point (G). A heater wire (801) is connected between the power supply part 601 at the first corner A and the current return part 701 at the center point (G).

The second region CH2 is disposed in a rectangular portion between the second corner B and the center point (G). The power supply part 601 is disposed at the second corner B. A heater wire (801) is connected between the power supply part 601 at the second corner B and the current return part 701 at the center point (G).

The third region CH3 is disposed in a rectangular portion between the third corner C and the center point (G). The power supply part 601 is disposed at the third corner C. A heater wire (801) is connected between the power supply part 601 at the third corner C and the current return part 701 at the center point (G).

The fourth region CH4 is disposed in a rectangular portion between the fourth corner A and the center point (G). The power supply part 601 is disposed at the fourth corner D. A heater wire (801) is connected between the power supply part 601 at the fourth corner D and the current return part 701 at the center point (G).

The first region CH1 and the second region CH2 are disposed rotationally symmetrically with respect to the center point (G). Similarly, the first region CH1 and the third region CH3, as well as the first region CH1 and the fourth region CH4 are also disposed rotationally symmetrically with respect to the center point (G). It can be rephrased that the four, first to fourth regions (CH1 to CH4) are each disposed while one side of the rectangle of the region faces one side of the rectangle of the adjacent region.

In other words, as viewed from above, the current return part 701 being the return path is disposed at the location (G) where the four corners of the four rectangular regions (CH1 to CH4) adjacent to each other are adjacent to each other. Each of the four rectangular regions (CH1 to CH4) is connected to the power supply part (601) as the power supply path at the corner (A, B, C, D) at a diagonal position of the corner to which that return path (701) is connected.

Figure 9:
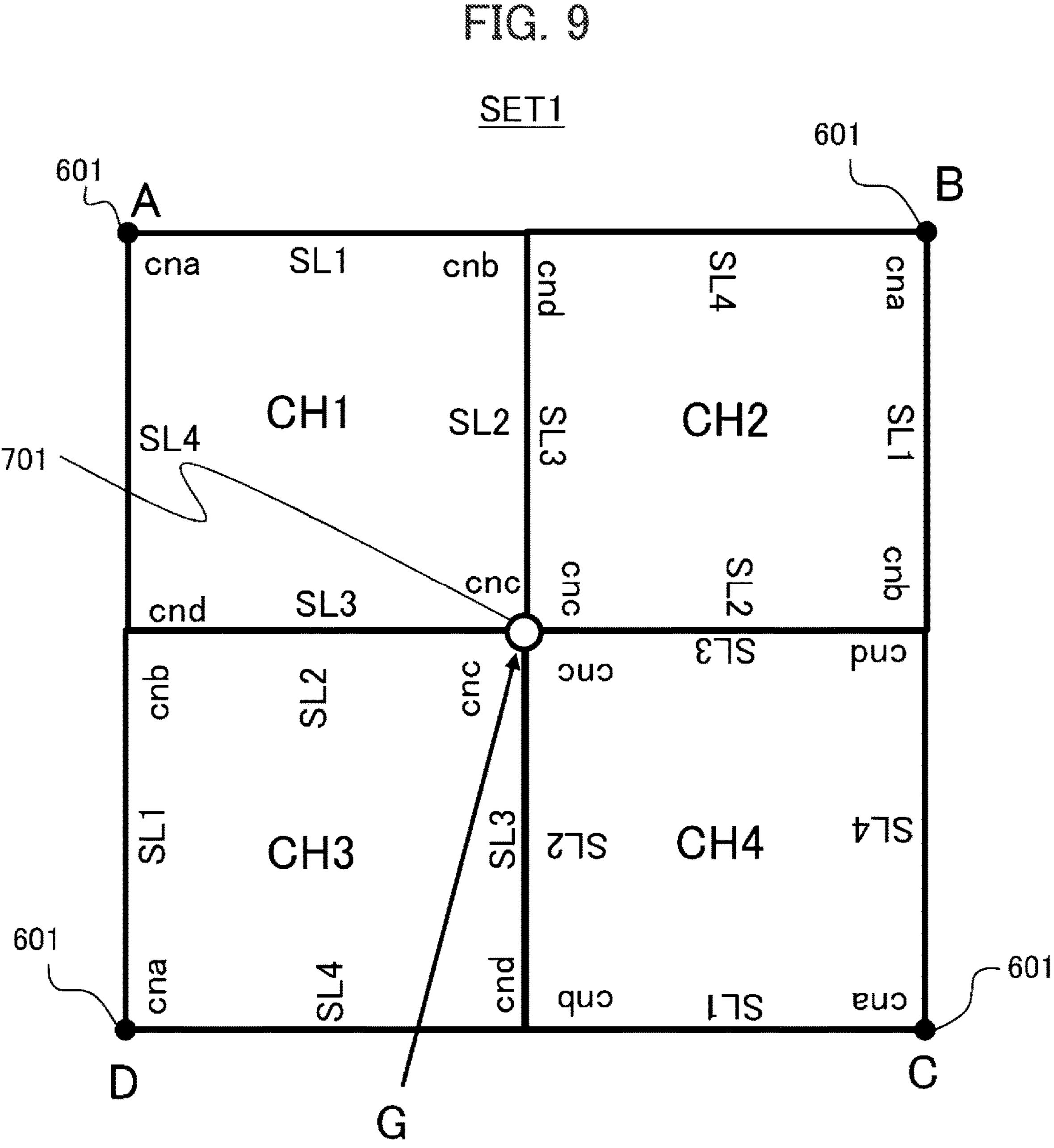
FIG. 9 is a schematic diagram illustrating a relationship between four corners (first corner cna, second corner cnb, third corner cnc, fourth corner cnd) as well as four sides (first side SL1, second side SL2, third side SL3, fourth side SL4) of a rectangular region 501 described with FIG. 5, and four regions (first region CH1, second region CH2, third region CH3, fourth region CH4) shown in FIG. 7.

FIG. 9 is a schematic diagram illustrating the relationship between the four corners (first corner cna, second corner cnb, third corner cnc, fourth corner cnd) as well as the four sides (first side SL1, second side SL2, third side SL3, fourth side SL4) of the rectangular region 501 described with FIG. 5 and the four regions (first region CH1, second region CH2, third region CH3, fourth region CH4) in FIG. 7.

Since the second region CH2 is disposed in matching with the first region CH1 rotated by 90 degrees to the right with respect to the center point (G) or the third corner cnc, the second side SL2 of the first region CH1 overlaps with the third side SL3 of the second region CH2. Similarly, since the fourth region CH4 is disposed in matching with the second region CH2 rotated by 90 degrees to the right with respect to the center point (G), the second side SL2 of the second region CH2 overlaps with the third side SL3 of the fourth region CH4.

Since the third region CH3 is disposed in matching with the fourth region CH4 rotated by 90 degrees to the right with respect to the center point (G), the second side SL2 of the fourth region CH4 overlaps with the third side SL3 of the third region CH3. The second side SL2 of the third region CH3 overlaps with the third side SL3 of the first region CH3.

In other words, the four, first to fourth regions (CH1 -CH4) are disposed while one sides (second side SL2 and third side SL3) of their rectangles face each other between the adjacent regions (first region CH1 and second region CH2, second region CH2 and fourth region CH4, fourth region CH4 and third region CH3, and third region CH3 and first region CH1). At the center point (G), the third corners cnc of four regions (first region CH1, second region CH2, third region CH3, and fourth region CH4) are adjacent to each other.

As illustrated in FIG. 8, potential of at least one of the connector portions of the power supply parts 601, which are located at the diagonal corners (B, D) among the corners (A, B, C, D) of the four regions 501 in each of which the current return part 701 is disposed, is set to a negative potential (−) with respect to the connector portion of the current return part 701 set to the ground potential (0V)). In this embodiment, the polarity of the potential of the connector portion, which has been set to a positive potential (+) value, at two power supply parts 601, is reversed and set to a negative potential (−) value in the other two power supply parts 601. In other words, potential of at least one location (A, B, C, or D), at which each film heater (801) is connected to each of the power supply parts (601) being the four power supply paths, is made lower (negative potential (−)) than the potential (0V: ground potential) of the point (G) where each relevant film heater (801) is connected to one return path (701).

As a result, a current (I1, I3), which flows from the power supply part 601, which is set to a positive potential (+) value in the four grid set (SET1), through the first heater film 202 (heater wire 801: resistance elements R1, R3) to the current return part 701 is partially offset by a current (I2, I4), which flows from the current return part 701 through the first heater film 202 (heater wire 801: resistance elements R2, R4) to the power supply part 601, which has been set to a negative potential (−) value. This makes it possible to reduce the current flowing through the return path from the current return part 701 to the power source. Consequently, it is possible to reduce size of the return path and suppress an increase in volume of the sample stage 120.

Description is now given with reference to FIGS. 6 and 8 on a case where the number of the power supply parts (601), the polarity of each of which is reversed, in the four grid region 501 set (SET1) (the number of negative potentials (−), each having a low potential relative to the current return part 701) is equal to the number of the power supply parts (601), the polarity of each of which is not reversed, (number of positive potentials (+), each having a high potential relative to the current return part 701). In FIGS. 6 and 8, a direction of the arrow ARM indicates a current flow direction, and signs of electrical resistance are omitted as appropriate in FIG. 6. In the example shown in FIGS. 7 and 8, in the four region 501 set (SET1), the number (two) of the power supply parts 601 with a higher potential (+) than the current return part 701 is set to two that is the same as that of the power supply parts 601 with a lower potential (−).

In such a configuration, it is possible to reduce the return current at the current return part (701) under a processing condition where distribution of temperature values during processing of the die region of the semiconductor device on the wafer 109 corresponding to each grid-like region 501 as shown in FIGS. 5 and 6 has rotational symmetry with respect to the center point 108C of the substrate 108.

This can be said to be because, if a temperature condition during processing of the wafer 109 has rotational symmetry, the calorific value of the first heater film 202 adjusted for each region 501 is also necessary to have rotational symmetry in order to achieve the relevant temperature distribution by heating the wafer 109. If the thermal resistivities of the heater wires 801 in the first heater film 202 are the same or similar enough to be considered the same between the regions 501, it can be said that similar rotational symmetry is required for the current flowing through the first heater film 202 of each region 501.

In other words, the set (SET1) of four grid-like regions 501 is disposed with rotational symmetry with respect to the center (G). In this configuration, if the number of the power supply parts 601 (number of positive potentials (+)) is equal to the number of the power supply parts 601 that are not reversed (number of negative potentials (−)), the magnitudes of the currents (I1, I2, I3, I4) flowing through the heater wires 801 located at line-symmetrical or point-symmetrical positions with respect to the center point G (current return part 701) are equal to each other, and the current flowing through the substrate 108 is apparently secured to be half of that in the case where the polarity is not reversed.

Further, under a condition where surface temperature of the substrate 108 is uniform across the entire surface (hereinafter referred to as flat temperature condition), currents flowing within the four grid set (SET1) are the same, and no current flows to the current return part 701.

In the peripheral edge 108P, even for the heater wires 801 at the end of the electrode, where three heater wires 801 share the current return part 701, the heater wires 801 have approximately the same temperature under a flat temperature condition or a temperature condition where temperature is higher near the electrode center. At this time, the return current at the current return part 701 can be expectedly suppressed to about one third compared to the case where reversal of polarity is not performed.

If polarity reversal is not performed, the current flowing through the substrate 108 increases with an increase in the number of heater wires 801. Joule heat is generated in the substrate 108 in proportion to the square of the magnitude of the current flowing through the substrate 108, which affects temperature control of the wafer 109. Alternatively, there is an expected risk of electric shock due to the large amount of current flowing through the substrate 108.

Figure 10:
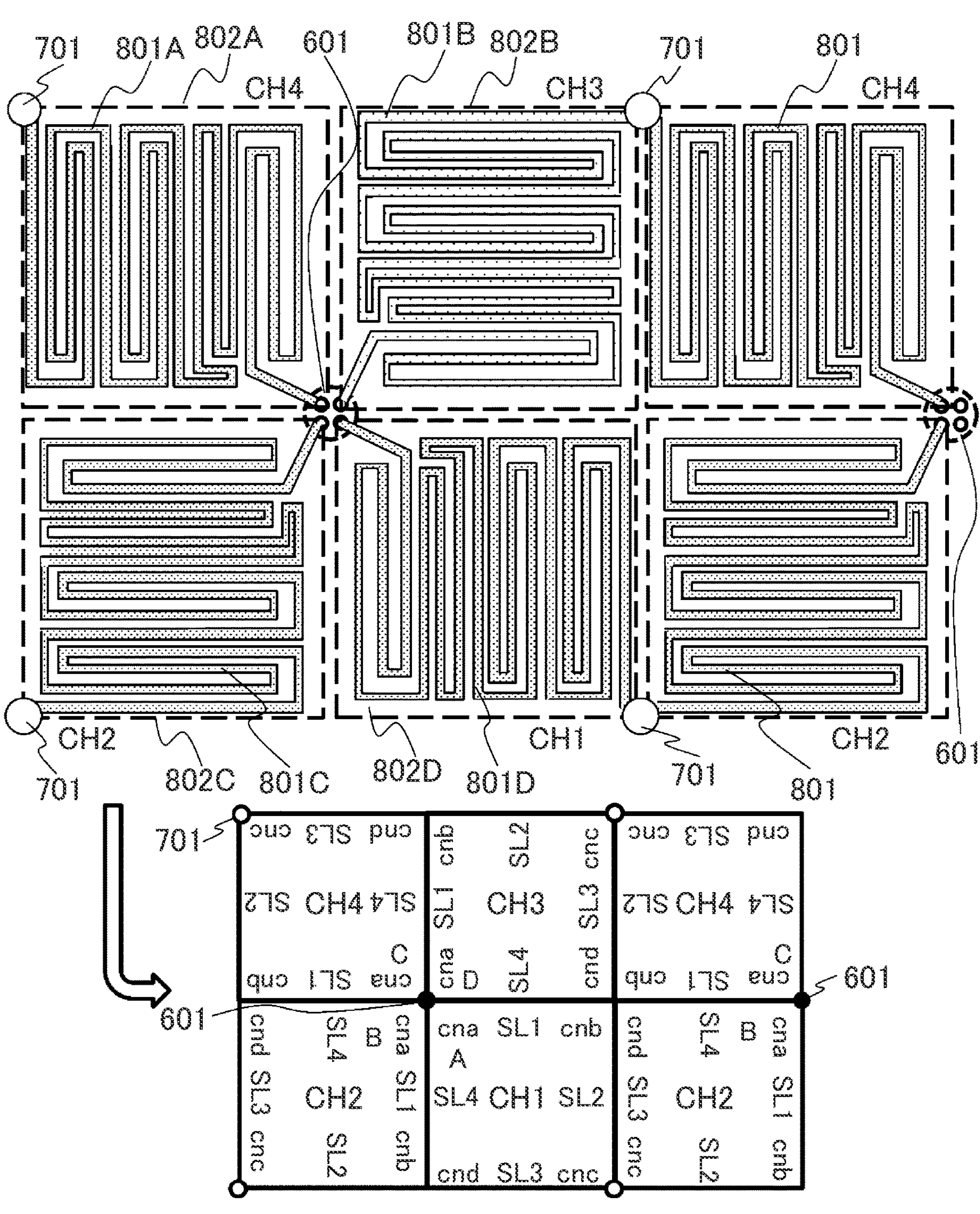
FIG. 10 is a plan diagram schematically illustrating arrangement of heaters, power supply parts, and return parts in a plurality of adjacent regions disposed on the upper surface of the sample stage according to the embodiment.
Figure 11:
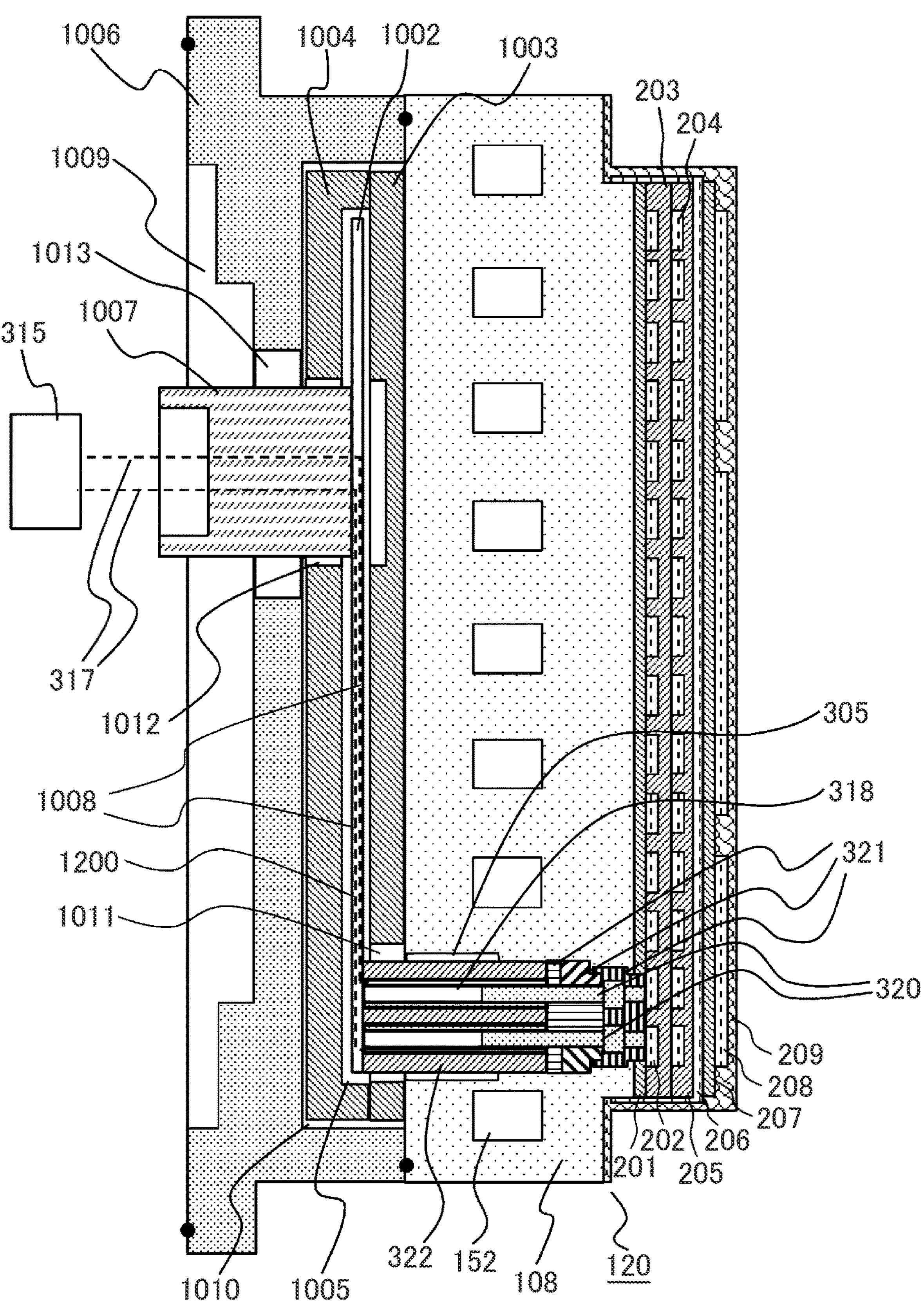
FIG. 11 is a vertical cross sectional diagram schematically illustrating an outline of a structure of a lower part of the sample stage of the plasma processing apparatus according to the embodiment as shown in FIG. 1.

Configurations of the power supply part 601 and the insulating connector below the power supply part 601 are described in detail with reference to FIGS. 10 and 11. FIG. 10 is a plan diagram schematically illustrating disposition of heaters, the power supply parts, and the return parts in the plurality of adjacent regions disposed on the upper surface of the sample stage according to this embodiment. FIG. 10 exemplarily shows, for reference, reference signs for the four, first to fourth regions (CH1 to CH4) shown in FIGS. 7, 8, and 9, and a correspondence relationship of the reference signs to the first to fourth regions (CH1 to CH4) shown in FIG. 9. Since the sides, corners, and layout of the first to fourth regions (CH1 to CH4) shown in FIG. 10 can be referred to the description on FIG. 9, duplicated description is omitted. In FIG. 10, a location at which the respective corners A, B, C, and D of the first to fourth regions (CH1 to CH4) butt together is shown as the power supply part 601. The heater power supply hole 305 with an opening in the bottom of the substrate 108 is provided below the power supply part 601, the lower insulating connector 322 is attached in the heater power supply hole 305 in an insertional manner, and power is supplied to the plurality of film heater wires 801 disposed in the first to fourth regions (CH1 to CH4) via the lower insulating connector 322.

As illustrated in FIG. 10, the first heater film 202 (heater wire 801) in this embodiment is designed such that a linear heater wire 801 having a predetermined width is disposed to reciprocate along the sides of the rectangle over almost the entire area of the rectangular region inside the dielectric film 203 on the dielectric film 201. At the location where the four corners (corresponding to corners A, B, C, and D shown in FIGS. 7, 8, and 9) of the rectangular regions, in each of which the first heater film 202 is disposed, are butted together, one end of each of the heater wires 801 in the four regions is disposed, and the power supply part 601, at which an undepicted power supply pin 320 (see FIG. 3) disposed below the location is connected to one end of the heater wire 801, is disposed. Electric power from the DC power source 315 is supplied from the power supply part 601 to each heater wire 801 through the one end.

The four power supply pins 320 are disposed and fixed axially symmetrically around the vertical central axis of the cylindrical, upper insulating connector 321 disposed in the upper part of the heater power supply hole 305, and the lower end of each power supply pin 320 protruding toward the lower side of the upper insulating connector 321 is inserted into one of the four through holes 318 disposed axially symmetrically around the central axis of the lower insulating connector 322 and connected to the terminal while the cylindrical lower insulating connector 322 is inserted into the heater power supply hole 305 from below. Each power supply pin 320 is electrically connected to the DC power source 315 through the terminal in the through hole 318.

In this way, in the power supply part 601, each power supply pin 320 is connected to one end of one of the heater wires 801 in the four different regions, which are disposed with their corners butted together, to supply DC power. The four regions (first to fourth regions: CH1 to CH4) have different heater sets, to each of which the internal heater wire 801 belongs, and one power supply part 601 has a configuration where power can be supplied to a set of four different heaters while the power supply pin 320 is inserted into the through hole 318.

The structure below the substrate 108 of the sample stage 120 according to this embodiment is now described with reference to FIG. 11. FIG. 11 is a vertical cross sectional diagram schematically illustrating an outline of the structure below the sample stage of the plasma processing apparatus according to the embodiment shown in FIG. 1. A space, in which power supply paths to the heater films 202 and 204 are disposed, is provided below the sample stage 120. The space is partitioned from the processing chamber 104 in an airtightly sealed manner, and communicates with a space outside the plasma processing apparatus 100 and is thus maintained at atmospheric pressure or roughly atmospheric pressure.

The lower end of the lower insulating connector 322 is connected to a tip end of a flexible printed circuit (hereinafter referred to as FPC) 1002 including a plurality of power supply lines 1008 for the heater film 202. The FPC 1002 connected to a circular bottom surface at the lower end of each cylindrical, lower insulating connector 322 includes a plurality of arm parts 1200 each having a predetermined width and extending in the horizontal direction (vertical direction in the figure). Each of the arm parts 1200 is mainly provided between the lower end of a corresponding lower insulating connector 322 and a corresponding collective connector 1007, and is disposed so as to extend along the bottom surface of the substrate 108. The flexible printed wiring board 1002 can be rephrased as a wiring component made of a resin-made plate-like component, and includes a plurality of power supply lines 1008 to which power for the heater films 202 is supplied from the DC power source 315. Each of the plurality of film heater wires 801 disposed in the plurality of regions, i.e., the first to fourth regions CH1 to CH4, is therefore electrically connected to one of the plurality of power supply lines 1008 on the flexible printed wiring board 1002 via the lower insulating connectors 322 being the power supply connectors.

As described with FIG. 3, a plurality of through holes (for example, the heat-conductive gas supply holes 301, the lift-pin through holes 302, the electrostatic adsorption power supply holes 303, the heater power supply holes 304 for the second heater films 204, through holes through which detection lines of a plurality of temperature sensors TS are passed, and the like) are provided in the bottom of the substrate 108 of the sample stage 120. The power supply lines to the lower insulating connectors 322 provided at the power supply parts 601 are therefore necessary to be provided while bypassing placing regions of the plurality of through holes provided in the bottom of the substrate 108. The arm parts 1200 of the flexible printed wiring board 1002 advantageously easily enable to bypass the placing regions of the through holes.

When viewed from above, width of the arm part 1200 is slightly smaller than diameter of one lower insulating connector 322, for example. The upper surface of the tip end of one corresponding arm part 1200 is joined to the bottom surface of the corresponding lower insulating connector 322. Since one lower insulating connector 322 has four through holes 318 into which four power supply pins 320 are inserted, the power supply lines 1008 disposed inside the FPC 1002 corresponding to the arm parts 1200 are configured such that, with four power supply lines as one set, each of tip ends at one ends of the four power supply lines is electrically connected to one terminal that engages and contacts with the power supply pin 320 disposed inside each of the four through holes 318.

The other end of the power supply line 1008 disposed inside each of the arm parts 1200 is connected to one of the plurality of power supply lines disposed inside the collective connector 1007 disposed in the central portion while being in contact with the bottom surface of the FPC 1002. In the inside of the collective connector 1007, a plurality of power supply lines extending in the vertical direction, the upper ends of which are respectively connected to the power supply lines 1008 disposed inside the arm parts 1200, are grouped together as one set. At the lower part of the collective connector 1007, the lower ends of the power supply lines configure a connector portion to be connected to the power supply paths 317 that electrically connect the power supply lines to the DC power source 315, and another connector configuring the tip ends of the power supply paths 317 is connected to the connector portion.

In the first heater film 202, a set of the heater wires 801, which are disposed over almost the entire area within the rectangular region, has the common return part 701 with basically four heater wires 801 as one set in the central portion on the upper surface of the sample stage 120 and with two or three heater wires 801 as one set in the peripheral edge (see FIG. 6). In FIG. 10, the power supply part 601 is disposed at the location where the corners (C, D, B, A) of the four regions 802A to 802D of the respective rectangular first heater films 202 are butted, and the upper insulating connector 321, the lower insulating connector 322, and the four power supply pins 320 are disposed below the power supply part 601. The lower insulating connector 322 to be connected to the upper insulating connector 321 is connected to the upper insulating connector 321 to be connected to the power supply part 601 for the plurality of first heater films 202, on the tip end of the arm part 1200 of the FPC 1002. The number of the arm parts 1200 of the FPC 1002 is the same as the number of the lower insulating connectors 322. The number of the arm parts 1200 of the FPC 1002 is the same as the number of the upper insulating connectors 321.

The regions 802A (CH4), 802B (CH3), 802C (CH2), and 802D (CH1) as well as the heater wires 801A, 801B, 801C, and 801D disposed inside the respective regions as shown in FIG. 10 belong to different sets of heaters. The power supply path, which is isolated from the substrate 108 by the upper insulating connector 321 to be connected to the power supply part 601 and the lower insulating connector 322 connected thereto, is connected to the different sets of heaters.

As shown in the figure, the arm parts 1200 of the FPC 1002 are disposed below the bottom surface of the substrate 108 and extend along the surface. The collective connector 1007 having a predetermined height is disposed in contact with the lower surface of the FPC 1002 below the central portion of FPC 1002. The collective connector 1007 is connected to another connector (not shown) configuring the power supply path 317, and thus the power supply part 601 is electrically connected to the DC power source 315 while the lower insulating connector 322 is connected to the upper insulating connector 321.

Insulating plates 1003 and 1004 are disposed between the FPC1002 and the bottom surface of the substrate 108 above the FPC1002, and between the FPC1002 and a universal plate 1006 made of a conductor such as metal disposed below the FPC1002, respectively. The Insulating plates 1003 and 1004 cover the FPC1002 to prevent electrical contact between the substrate 108 and the universal plate 1006, and between the FPC 1002 and the lower insulating connector 322, respectively. In the upper insulating plate 1003, through holes 1011 are provided at positions corresponding to the heater power supply holes 305. The lower insulating connector 322 joined to the tip end of the arm part 1200 of the FPC 1002 is inserted into the heater power supply hole 305 via the through hole 1011 from below the bottom surface of the insulating plate 1003 attached to the bottom surface of the substrate 108.

The insulating plates 1003 and 1004 are each a circular plate-like component and connectable in the vertical direction. At least one of the opposing surfaces of the insulating plates 1003 and 1004 has a recessed part so that when the insulating plate 1003 or 1004 is connected, a gap 1005 is formed in a region of a connection of the insulating plates 1003 and 1004. The FPC 1002 and the arm part 1200 are housed in the gap 1005 formed between the insulating plates 1003 and 1004 while the insulating plates 1003 and 1004 are connected together. Height of the lower insulating connector 322 is designed such that the lower insulating connector 322 protrudes from the bottom surface of the substrate 108 while being connected to the upper insulating connector 321, and such protruding height is larger than at least the vertical length of the through hole 1011 in the upper insulating plate 1003, i.e., than the thickness of the FPC 1002.

Further, a through hole 1012 is provided in the central portion of the lower insulating plate 1004. The collective connector 1007, which is connected to the lower surface of the central portion of the FPC 1002 sandwiched between the insulating plates 1003 and 1004, is inserted into the through hole 1012 while the insulating plates 1003 and 1004 are connected together. The lower end of the collective connector 1007 may protrude down the universal plate 1006 through the through hole 1012.

The insulating plate 1004 is attached to the insulating plate 1003 or the substrate 108 while sandwiching the FPC1002 between it and the insulating plate 1003 and covering the FPC1002 from below. As a result, the FPC 1002 is held within the gap 1005 having a height slightly greater than the vertical thickness of the FPC 1002. As a result, vertical movement of the FPC 1002, particularly vertical movement of the lower insulating connector 322 joined to the tip end of the arm part 1200, is suppressed. This reduces unintended breakage of engagement or connection with the power supply pin 320 of the lower insulating connector 322.

Further, the universal plate 1006 is provided. The universal plate 1006 is disposed below the substrate 108 and the insulating plates 1003 and 1004, and has a disk shape where the peripheral edge of the upper surface of the universal plate 1006 is connected to the peripheral edge of the bottom surface of the substrate 108. The upper end of the peripheral edge of the upper part of the universal plate 1006 is attached to the peripheral edge of the bottom surface of the substrate 108 with a sealing component such as an O-ring in between, so that a space inside the processing chamber 104 is airtightly sealed. Further, a cylindrical recessed part forming a gap 1010 is provided in the central portion of the upper surface of the universal plate 1006 while the universal plate 1006 is attached to the substrate 108. The cylindrical recessed part forming the gap 1010 is configured so as to house inside the insulating plate 1003 attached to the bottom surface of the substrate 108 and the insulating plate 1004 with the FPC 1002 held within the gap 1005.

At the peripheral edge of the bottom surface of the universal plate 1006, a sealing component such as an O-ring is attached to the peripheral edge while being sandwiched between the peripheral edge and a circular component, which is disposed below the sample stage 120, of the plasma etching apparatus 100, so that the space inside the processing chamber 104 is airtightly sealed. An upwardly recessed, recessed part 1009 is disposed in the central portion of the bottom surface of the universal plate 1006, and connectors for the power supply paths to the heater film 204 and the electrode film 208 and a temperature sensor to detect local temperature of the substrate 108 are attached to the bottom surface (recessed part 1009) of the universal plate 1006. The connectors for the power supply paths to the heater film 204 and the electrode film 208 and the temperature sensor to detect local temperature of the substrate 108 are inserted into the substrate 108 through the universal plate 1006 and the insulating plates 1003 and 1004. The space, which faces the bottom surface of the universal plate 1006, below the sample stage 120 has atmospheric pressure or a pressure approximate to the atmospheric pressure, and the gap 1005 and the inside of the heater power supply hole 305, each communicating with that space, are also kept at the same pressure.

A through hole 1013 is provided in the central portion of the upper part of the universal plate 1006, and the collective connector 1007 connected to the lower surface of the central portion of the FPC 1002 is inserted into the through hole 1013 while the universal plate 1006 is connected to the substrate 108. The lower end of the collective connector 1007 may protrude downward from the lower end of the through hole 1013. Another connector configuring the power supply path 317 is connected to the collective connector 1007 within the recessed part 1009 of the universal plate 1006.

Figure 12:
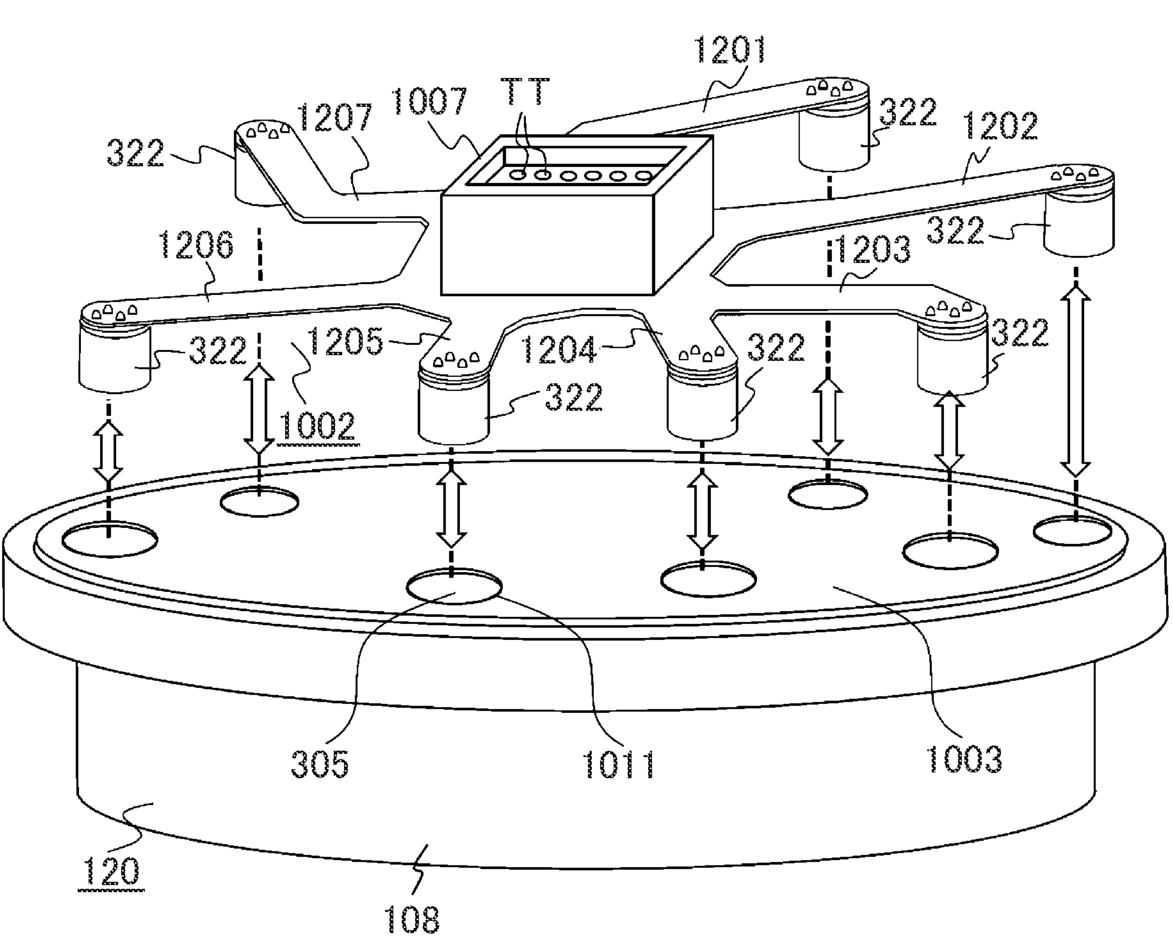
FIG. 12 is a perspective diagram schematically illustrating an outline of an overall configuration of FPC provided at the lower part of the sample stage shown in FIG. 11.

An exemplary configuration of the FPC 1002 is now described with reference to FIG. 12. FIG. 12 is a perspective diagram schematically illustrating the overall configuration of the FPC according to the example embodiment shown in FIG. 11. Although FIG. 12 shows an exemplary configuration of the FPC 1002, the configuration of the FPC 1002 is not limited to that shown in FIG. 12. For one substrate 108 of the sample stage 120, a plurality of sets, for example, two, three, or four sets, each set including the FPC 1002 (including a plurality of arm parts 1200) and the collective connector 1007, may be provided.

To provide power supply line while bypassing the provided regions of the plurality of through holes (vertical hole structures provided in the substrate 108, for example, the heat-conductive gas supply holes 301, the lift-pin through holes 302, the electrostatic adsorption power supply holes 303, the heater power supply holes 304 for the second heater film 204, through holes through which detection lines of the plurality of temperature sensors TS pass, and the like) provided in the bottom of the substrate 108, and to avoid a T-shaped power supply line structure (power supply line structure with no branch portions in the power supply line), it is preferable to provide a plurality of sets, each set including the FPC 1002 (including a plurality of arm parts 1200) and the collective connector 1007, for one substrate 108.

As described above, the FPC 1002 has the plurality of arm parts 1200 (1201 to 1207) (seven arms are shown as an example in FIG. 12). The plurality of arm parts 1201 to 1207 extend from the central portion of the bottom surface of the FPC 1002 toward the peripheral side thereof, and each have a predetermined width. The cylindrical lower insulating connector 322 is connected to the upper surface of the tip end of each of the arm parts 1201 to 1207. In this example, the seven lower insulating connectors 322 having the same size and shape are respectively connected to the tip ends of the arms 1201 to 1207. The heater power supply hole 305 and the through hole 1011, through which the lower insulating connector 322 is inserted, have the same diameter and depth, and the upper insulating connector 321 to be in contact with the lower insulating connector 322 also has the same dimension and shape.

The collective connector 1007 is connected to the lower surface of the central portion of the FPC 1002, and the collective connector 1007 protrudes downward (upward in the figure) with a predetermined height from the lower surface of the FPC 1002. The recessed part 1009, which is formed inside the lower part of the collective connector 1007, may protrude into the recessed part 1009.

The upper ends of the plurality of terminals TT, which are disposed vertically in parallel at a distance in both the lateral and longitudinal directions of the inside of the collective connector 1007, or the wiring lines connected to the terminals TT are connected to the respective ends of the plurality of power supply lines 1008 built in the FPC 1002 inside the FPC 1002 above the upper end of the collective connector 1007. The respective power supply lines 1008 are disposed inside the arm parts 1201 to 1207, and the respective other ends of the power supply lines 1008 are electrically connected to the terminals housed inside the through holes 318 of the respective lower insulating connectors 322 connected to the ends of the arm parts 1201 to 1207.

In this embodiment, with the FPC 1002, each lower insulating connector 322 is inserted into the corresponding heater power supply hole 305 through the through hole 1011 formed at a corresponding location with the vertical axes aligned, with the upper insulating plate 1003 connected to the bottom surface of the substrate 108 between the FPC 1002 and the substrate 108. The arm parts 1201 to 1207 and the central portion of the FPC 1002, which each include the plurality of power supply lines 1008 inside, are made of a plate-like resin-made component, of which the width in the horizontal direction (left-right direction) is sufficiently larger than the thickness in the vertical direction (up-and-down direction) crossing the horizontal direction. As a result, in a state where the lower insulating connector 322 is inserted into the corresponding heater power supply hole 305, each of the plate-like arm parts 1201 to 1207 having a small thickness (thin thickness) and connected with the lower insulating connector 322 extends from the central portion of the FPC 1002 along the insulating plate 1003 or 1004 or along the bottom surface of the substrate 108.

In addition, at least the arm parts 1201 to 1207 of the FPC 1002 have relatively large flexibility in the vertical direction or can be bent. On the other hand, if any of the arm parts 1201 to 1207 undergoes bending deformation in the left-right direction (horizontal direction), any of the arm parts 1201 to 1207 is twisted, and the twisted arm parts 1201 to 1207 are turned over, possibly leading to a larger vertical height occupied by the arm parts 1201 to 1207.

In this embodiment, the cylindrical lower insulating connector 322 has a plurality of through holes 318 (see FIGS. 11 and 13) with built-in terminals, and the through holes 318 are disposed axially symmetrically around the central axis in the vertical direction. As a result, four positions may exist around the central axis, at each of which the lower insulating connector 322 can be inserted into the heater power supply hole 305 and connected with the power supply pin 320 held by the upper insulating connector 321. When the lower insulating connector 322 is electrically connected correctly to the FPC1002, and If the power supply pin 320 is inserted at a wrong position around the axis of the lower insulating connector 322 within the heater power supply hole 305, the arm parts 1201 to 1207 of the FPC 1002, to each of which the lower insulating connector 322 is connected to the tip end of the arm part, is turned over, so that the propriety of the connection can be easily determined visually.

Figure 13:
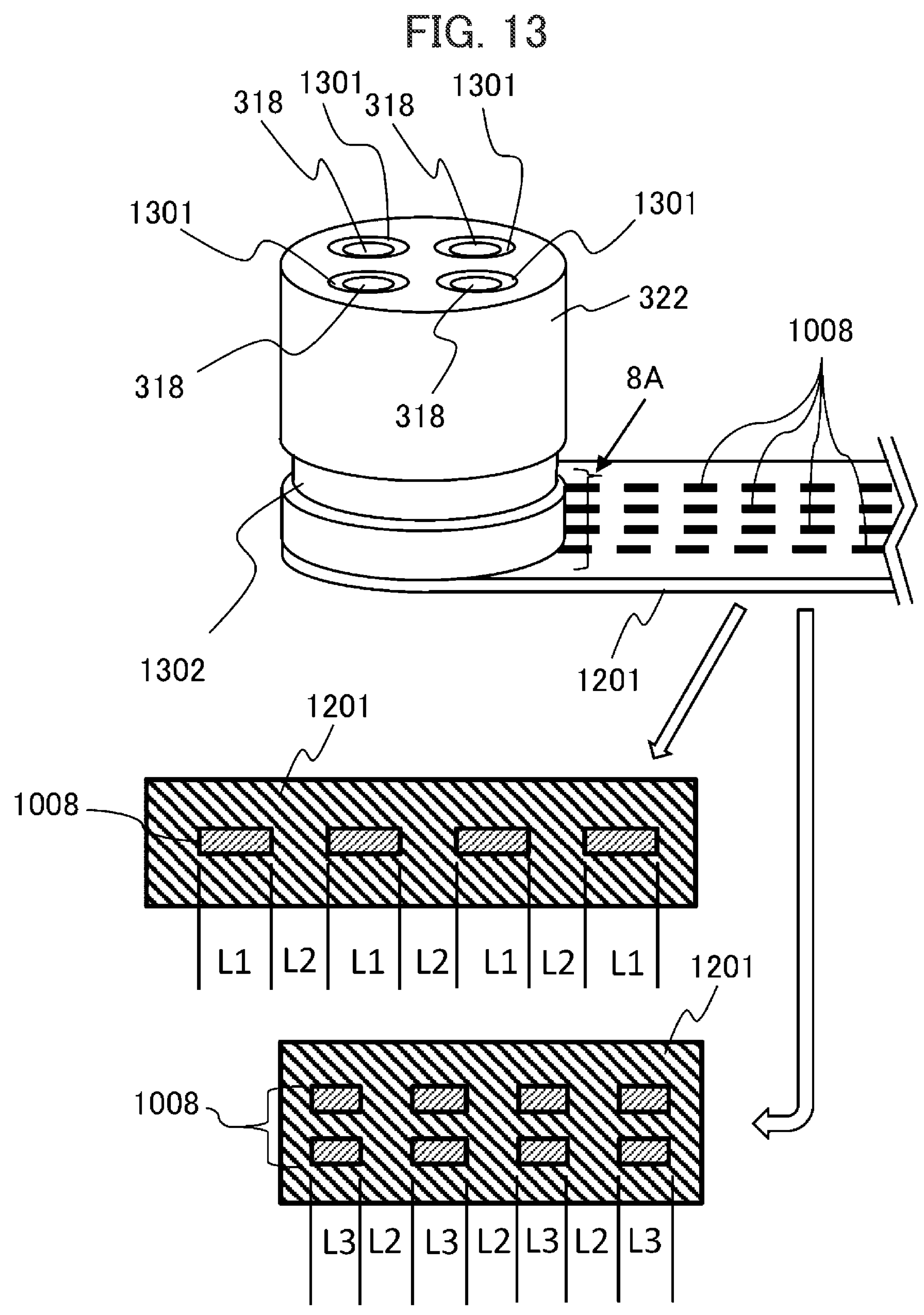
FIG. 13 is a perspective diagram schematically illustrating an outline of a configuration of a tip end of an arm part of the FPC shown in FIG. 12.

FIG. 13 shows in detail a configuration where the lower power supply connector 322 is connected to the tip end of the arm part of the FPC 1002. FIG. 13 is a perspective diagram schematically illustrating a configuration of the tip end of the arm part of the FPC according to the example embodiment shown in FIG. 11. In FIG. 13, one of the arm parts 1201 to 1207 shown in FIG. 12 is shown in an enlarged manner (the lower insulating connector 322 at the tip end of arm part 1201 is shown herein in an enlarged manner as a typical example).

As mentioned above, for the lower insulating connector 322, four through holes 318, which vertically penetrate between the circular upper and lower surfaces, are disposed axially symmetrically around the central axis, and a socket 1301, which acts as a connection terminal when the power supply pin 320 is inserted into the through hole 318, is press-fitted in each through hole 318. A groove 1302 is formed in the circumferential direction in the lower part of the cylindrical peripheral sidewall of the cylindrical lower insulating connector 322, and the lower end of the lower insulating connector 322 including the groove 1302 protrudes down the lower end of the through hole 1011 in the upper insulating plate 1003 below the substrate 108 while the power supply pin 320 is inserted inside the heater power supply hole 305 and in contact with the upper insulating connector 321. With this configuration, when an operator places the tip of his/her finger or nail on the groove 1302, the operator can easily perform operation of inserting the lower insulating connector 322 into the heater power supply hole 305, and operation of removing the lower insulating connector 322 from the inside of the heater power supply hole 305.

In FIG. 13, a configuration of the arm part 1201 is shown as a typical one among the seven arm parts. The other arm parts 1202 to 1207 each have the same configuration as the arm part 1201 shown in FIG. 13. The arm part 1201 is made of a resin component, including polyimide, formed into a film shape, and inside the arm part 1201, several (four in this example) power supply lines 1008 are disposed with a predetermined distance L2 in the longitudinal direction (left-right direction with respect to the extending direction (or horizontal direction with respect to the bottom surface of the substrate 108) of the power supply line 1008 while being sandwiched vertically between resin components. The line width L1 of each of the power supply lines 1008 is selected so as to ensure sufficient current withstanding performance. The power supply lines 1008 may also be formed in a vertically stacked manner so as to have a line width L1 (=L3+L3) that can ensure sufficient current withstanding performance. One end 8A of each power supply line 1008 is connected to one socket 1301 by soldering.

Figure 14:
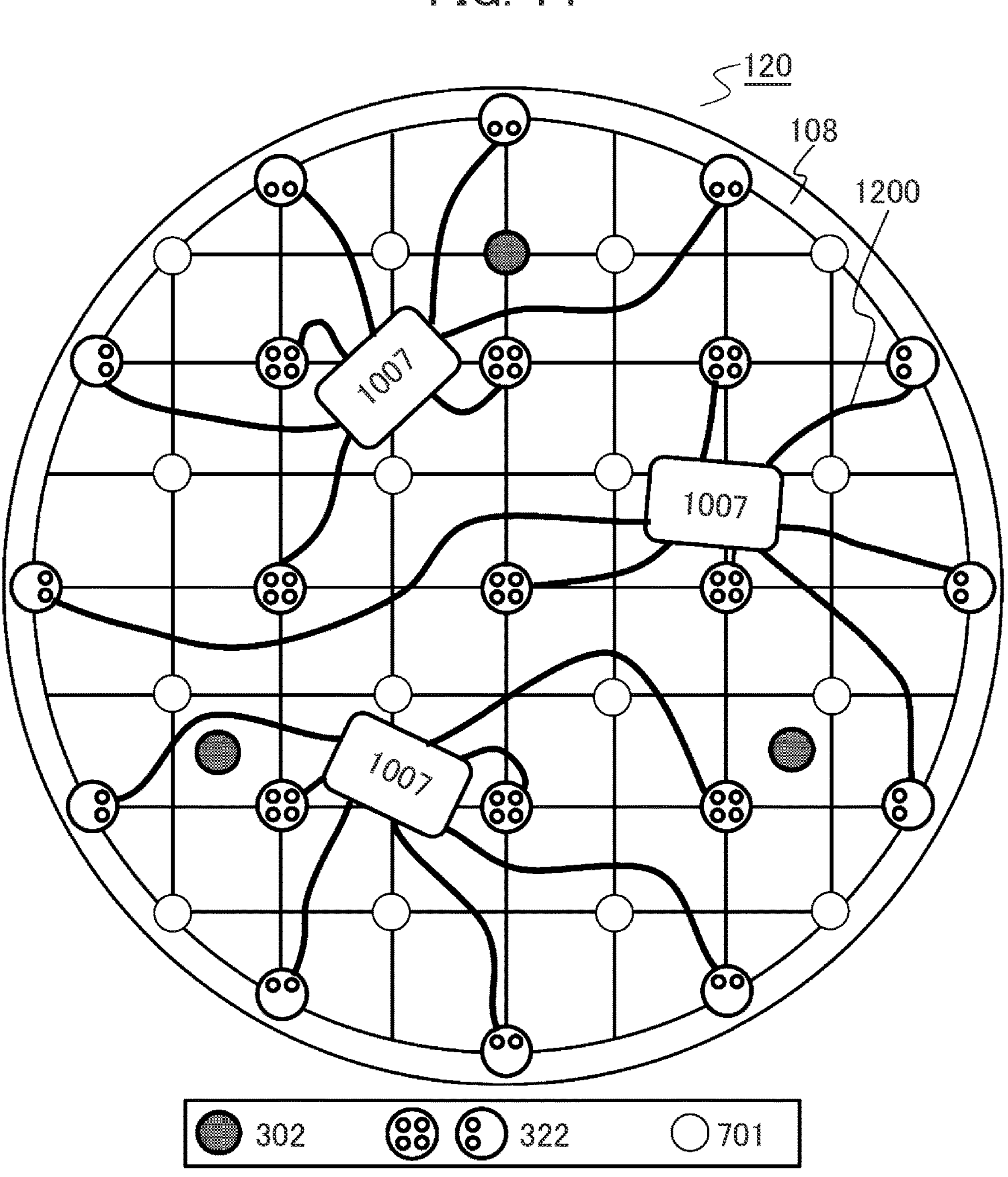
FIG. 14 is a plan diagram schematically illustrating an outline of a configuration of FPC according to a modification.

FIG. 14 is a plan diagram schematically illustrating a configuration of FPC according to a modification. FIG. 14 exemplarily illustrates a configuration example of the back surface of the substrate 108 when three sets, each set including the FPC 1002 (including the plurality of arm parts) and the collective connector 1007, are provided for one substrate 108 of the sample stage 120. As illustrated in FIG. 14, a plurality of lower insulating connectors 322 inset in the heater power supply holes 305, three collective connectors 1007, a plurality of return parts 701, and three lift-pin through holes 302 are provided on the back of the substrate 108.

As the plurality of lower insulating connectors 322, lower insulating connectors 322, in each of which four power supply pins 320 are disposed (first lower insulating connector 322: four small circles are disposed in one circle), and lower insulating connectors 322, in each of which two power supply pins 320 are disposed (second lower insulating connector 322: two small circles are disposed in one circle), are disposed. The second lower insulating connectors 322 are mainly disposed in the periphery of the substrate 108. A plurality of thick lines provided between the collective connector 1007 and the lower insulating connector 322 correspond to the plurality of arm parts 1200 of the FPC 1002. In this example, one collective connector 1007 is connected to twenty heater wires 801, and temperatures of sixty heater wires 801 provided in sixty regions can be controlled by three collective connectors 1007.

As illustrated in FIG. 14, the thick lines indicating the arm parts 1200 of the FPC 1002 disposed between the collective connector 1007 and the lower insulating connector 322 are disposed so as to bypass (avoid) disposition regions of the lift-pin through hole 302 and the return part 701 provided in the substrate 108. In other words, for the planar layout of the arm parts 1200 of the FPC 1002, the planar layout of the wiring region is determined so as to bypass (avoid) the disposition regions of the through holes (for example, heat-conductive gas supply holes 301, lift-pin through holes 302, electrostatic adsorption power supply holes 303, heater power supply holes 304 for second heater films 204, and through holes through which detection lines of temperature sensors TS are passed) provided in the bottom of the substrate 108, and so as to prevent the arm parts 1200 from crossing each other. Since the planar layout of the through holes provided in the bottom of the substrate 108 is known, the planar layout of the arm parts 1200 of the FPC 1002 can be determined relatively easily and at low cost.

As a result, wiring for power supply to the electrodes of the respective heater layers (heater wires) 801 in the multi-zone (zone configuration of the substrate 108, in which a plurality of sets, each set including the first region CH1 to the fourth region CH4, are provided) can be safely made at low cost.

INDUSTRIAL APPLICABILITY

The present disclosure is available to a plasma processing apparatus that processes a sample using plasma while controlling sample temperature.

LIST OF REFERENCE SIGNS

101: Vacuum container, 104: processing chamber, 108: substrate, 109: wafer, 120: sample stage, 140: dielectric film, 202: heater film, 202, 305: heater power supply hole, 315: DC power source, 317: power supply path, 318: through hole, 320: power supply pin, 321: upper insulating connector, 322: lower insulating connector, 601: power supply part, 701: return part, 801: heater, 1002: FPC, 1003, 1004: insulating plate, 1006: universal plate, 1007: collective connector.

The invention claimed is:

1. A plasma processing apparatus, comprising:

a processing chamber that is disposed inside a vacuum container and inside which a wafer to be processed is placed and plasma is generated; and a cylindrical sample stage disposed within the processing chamber and having an upper surface on which the wafer is placed, wherein the sample stage includes: a disc-like substrate; a dielectric film covering an upper surface of the substrate; and a heater layer disposed inside the dielectric film, the heater layer includes a plurality of film heaters respectively disposed in a plurality of rectangular regions, the plurality of regions are each disposed with one sides of the rectangular shapes facing to adjacent regions, a cylindrical power supply connector that is attached to and detached from a bottom of the substrate is provided, the power supply connector is configured to be electrically connected to one location of each of the plurality of film heaters respectively disposed in the plurality of regions to supply power from a DC power source, a wiring component is provided that includes inside thereof a plurality of lines to which the power is supplied and is made of a resin-made plate-like component connected to a bottom of the power supply connector, and the wiring component has an arm part extending along a bottom surface of the substrate.

2. The plasma processing apparatus according to claim 1, wherein the power supply connector is inserted to be mounted into a hole having an opening in a bottom surface of the substrate below a location where corners of the plurality of adjacent rectangular regions are butted to each other with the sides of the rectangular shapes facing each other, and the plurality of film heaters respectively disposed in the plurality of regions are electrically connected to the plurality of lines via the power supply connector.

3. The plasma processing apparatus according to claim 2, wherein the power supply connector is electrically connected to each of the plurality of film heaters while being inserted into the hole, and includes a plurality of terminals to be respectively connected to a plurality of pins, that is disposed axially symmetrically around a central axis of the hole.

4. The plasma processing apparatus according to claim 2, wherein the plurality of regions are four regions, and the power supply connector is disposed below the location where the corners of the four adjacent regions with the sides of the rectangular shapes facing each other are butted to each other, and the respective film heaters disposed in the four regions are electrically connected to the plurality of lines.

5. The plasma processing apparatus according to claim 2, further comprising:

one return path that is electrically connected to an end of each of the plurality of film heaters respectively disposed in the plurality of adjacent regions, and along which the supplied power returns to the DC power source via the end and the substrate.

* * * * *